(12) United States Patent
Komura

(10) Patent No.: US 6,624,608 B2
(45) Date of Patent: Sep. 23, 2003

(54) INDICATING INSTRUMENT FOR A VEHICLE

(75) Inventor: Takashi Komura, Toyota (JP)

(73) Assignee: Denso Corporation, Kariya (JP)

( * ) Notice: Subject to any disclaimer, the term of this patent is extended or adjusted under 35 U.S.C. 154(b) by 15 days.

(21) Appl. No.: 10/066,592

(22) Filed: Feb. 6, 2002

(65) Prior Publication Data

US 2002/0117988 A1 Aug. 29, 2002

(30) Foreign Application Priority Data

Mar. 13, 2001 (JP) ........................................ 2001-070870
Mar. 5, 2001 (JP) ........................................ 2001-060649
Feb. 23, 2001 (JP) ........................................ 2001-048714

(51) Int. Cl.$^7$ ................................................ H02P 8/00
(52) U.S. Cl. ........................ 318/696; 318/685; 310/49; 116/284; 116/288; 116/290; 116/303
(58) Field of Search .............................. 318/685, 696, 318/49; 116/284, 303, 288, 290; 368/324, 322, 323

(56) References Cited

U.S. PATENT DOCUMENTS

| | | | | |
|---|---|---|---|---|
| 3,667,042 A | * | 5/1972 | Engel et al. ................ | 324/174 |
| 4,611,193 A | * | 9/1986 | Bruggemann ................ | 340/52 |
| 4,878,453 A | * | 11/1989 | Inoue et al. ................ | 116/288 |
| 4,930,094 A | * | 5/1990 | Luitje et al. ................ | 364/561 |
| 5,032,781 A | | 7/1991 | Kronenberg | |
| 5,353,735 A | * | 10/1994 | Arai et al. ................ | 116/286 |
| 5,723,964 A | * | 3/1998 | Nakaba ................ | 318/599 |
| 5,877,694 A | * | 3/1999 | Kataoka ................ | 340/688 |
| 5,942,872 A | * | 8/1999 | Steger et al. ................ | 318/696 |
| 5,994,893 A | * | 11/1999 | Maruyama et al. ......... | 324/144 |
| 6,014,075 A | * | 1/2000 | Fujimori et al. ............ | 340/461 |
| 6,067,492 A | * | 5/2000 | Tabata et al. ................ | 701/51 |
| 6,302,551 B1 | * | 10/2001 | Matumoto ................ | 362/27 |
| 6,520,108 B1 | * | 2/2003 | Komura ................ | 116/284 |

FOREIGN PATENT DOCUMENTS

JP     06-022596     *  1/1994     ............. H02P/8/00

* cited by examiner

Primary Examiner—Bentsu Ro
Assistant Examiner—Tyrone Smith
(74) Attorney, Agent, or Firm—Posz & Bethards, PLC

(57) ABSTRACT

In an indicating instrument for a vehicle including a step motor and a stopper unit for stopping a pointer at a zero position, a memory for pre-storing a zero-level electric angle as a correction value at which zero-return alternating signal becomes a zero level at least twice after a zero-return signal is supplied. When the phase of the zero-return alternating signal becomes the zero-level electric angle, the zero-return signal is stopped to provide induced voltage induced in the stator of the step motor. If the induced voltage is lower than a threshold voltage, it is judged that the pointer is stopped.

11 Claims, 20 Drawing Sheets

INDICATING INSTRUMENT FOR A VEHICLE

CROSS REFERENCE TO RELATED APPLICATION

The present application is based on and claims priority from the following Japanese Patent Applications: 2001-48714, filed Feb. 23, 2001; 2001-60649, filed Mar. 5, 2001; and 2001-70870, filed Mar. 13, 2001; the contents of which are incorporated herein by reference.

BACKGROUND OF THE INVENTION

1. Field of the Invention

The present invention relates to an indicating instrument for a vehicle, such as a passenger car, a truck, a bus, or a motor cycle which has a step motor as the driving power source thereof.

2. Description of the Related Art

Usually, this type of the indicating instrument has a speed reduction gear train connected to the step motor and disposed at the back of a dial plate thereof. When the step motor drives the gear train by an input shaft thereof, an output shaft of the gear train rotates a pointer shaft to move a pointer over the front surface of the dial plate.

The indicating instrument includes a stopper unit that has a stopper and an arm. Such a stopper is a projection formed at a portion of an output gear of the gear train that corresponds to a zero-position or a reset position of the dial plate. The arm is supported by a stationary member at the back of the dial plate so that the edge thereof can engage the stopper when it returns to the zero-position. Thus, the stopper unit stops the pointer at the zero-position by the stopper.

If the pointer is returned to the zero-position, cosine wave voltage is applied to the step motor. Subsequently, the rotor of the step motor starts rotating or reversing toward the zero-position, and a voltage is induced in a field coil of the step motor. As the rotor rotates faster, the induced voltage becomes higher. When the induced voltage becomes lower than a threshold voltage, it is presumed that the pointer has returned to the zero-position. Consequently, the cosine wave voltage is stopped.

However, the rotation speed of the rotor is so low just after the cosine wave voltage is applied that the amplitude of the induced voltage is not sufficient to be compared. If this voltage is compared with a certain threshold voltage, the zero-position of the pointer may not be correctly judged.

SUMMARY OF THE INVENTION

Therefore, an object of the invention is to provide an indicating instrument in which a pointer can always return to a zero-position so that the pointer can indicate an accurate analog value, such as a vehicle speed, that is sensed by a sensor.

According to a feature of the invention, an indicating instrument for a vehicle includes a dial plate having a pointer disposed to move over the display portion between a zero position and a maximum position corresponding to the maximum value, a step motor including a stator for providing a rotating magnetic field corresponding to the analog value, and a magnet rotor connected to the pointer for moving the pointer in response to the rotating magnetic field, a stopper unit for stopping the pointer when the pointer reaches the zero position, zero-return means for supplying the stator with a zero-return alternating signal to move the pointer to the zero-position, storing means for pre-storing a zero-level electric angle in which the zero-return alternating signal becomes a zero level at least twice after the zero-return signal is supplied to the stator, first examining means for examining whether the phase angle of the zero-return alternating signal reaches the zero-level electric angle or not after the zero-return alternating signal is supplied to the stator, interrupting means for interrupting the zero-return alternating signal to provide induced voltage induced in the stator when it is presumed that the zero-return alternating signal reaches the zero-level electric angle, and second examining means for examining whether the induced voltage is lower than a threshold voltage that indicates that the pointer is stopped.

The indicating instrument may include a speed reduction gear train that is connected between the magnet rotor and the pointer so that the pointer can rotate at a reduced rotation speed proportional to a rotation speed of the magnet rotor.

The indicating instrument may further includes means for providing a pair of alternating signals, and the stator may be comprised of a pair of field coils for forming the rotating magnetic field when the pair of alternating signals are supplied thereto.

According to another feature of the invention, an indicating instrument for a vehicle includes a dial plate, a pointer, a step motor including a stator and a magnet rotor, a stopper unit for the pointer, drive means for supplying a stator of the step motor with a drive alternating signal, zero-return means for supplying the stator with a zero-return alternating signal, storing means for storing a phase angle of the zero-return signal as a zero-return angle correction value if an induced voltage, which is induced in the stator when the zero-return alternating signal is interrupted after the zero-return alternating signal becomes a zero level at least twice, becomes lower than a threshold value that indicates that the pointer is stopped, adjusting means for adjusting the zero-return alternating signal to zero phase by the zero-return angle correction value when the zero-return alternating signal is supplied to the stator, synchronizing means for synchronizing the zero-return alternating signal and rotation of the magnet rotor after the phase of the zero-return alternating signal is adjusted, first examining means for examining whether the phase angle of the zero-return alternating signal reaches a zero-level electric angle that corresponds to a zero level of the zero-return alternating signal at least twice or not after the alternating signal is supplied to the stator, and second examining means for examining whether the induced voltage is lower than a threshold voltage that indicates that the pointer reduction gear train is stopped. The drive means supplies the drive alternating signal at the phase thereof immediately when the second examining means judges that the induced voltage is lower than the threshold voltage.

The indicating instrument may further include a speed reduction gear train connected between the pointer and the pointer for moving the pointer at a reduced rotation speed proportional to a rotation speed of the magnet rotor or an accelerating means for decreasing phase angle of the zero-return alternating signal to accelerate the magnet rotor.

The indicating instrument may further include means for examining whether phase of the zero-return signal increases by a predetermined angle or not after the adjusting means adjust the zero-return alternating to zero phase, and means for decreasing phase of the zero-return signal to a phase that corresponds to the zero-return angle correction value.

Another object of the invention is to provide a system for setting and storing a zero-return correction angle of an indicating instrument. The zero-return correction angle, which varies due to variation in size of the parts and in assembling steps thereof, is provided for each indication instrument.

According to another feature of the invention, a system for setting a zero-return correction angle of a pointer of an indicating instrument is comprised of first means for adjusting a drive alternating signal to zero phase when the alternating signal is supplied to a step motor of the indicating instrument, second means for examining whether phase angle of the drive alternating signal reaches a zero-level electric angle that corresponds to a zero level of the drive alternating signal at least twice or not after the drive alternating signal is supplied to the step motor, third means for provide an induced voltage in the stator of the step motor induced by the magnet rotor of the step motor when the second means judges that the phase angle of the alternating signal reaches the zero-level electric angle.

BRIEF DESCRIPTION OF THE DRAWINGS

Other objects, features and characteristics of the present invention as well as the functions of related parts of the present invention will become clear from a study of the following detailed description, the appended claims and the drawings. In the drawings:

DETAILED DESCRIPTION OF THE PREFERRED EMBODIMENTS

Figure 1:
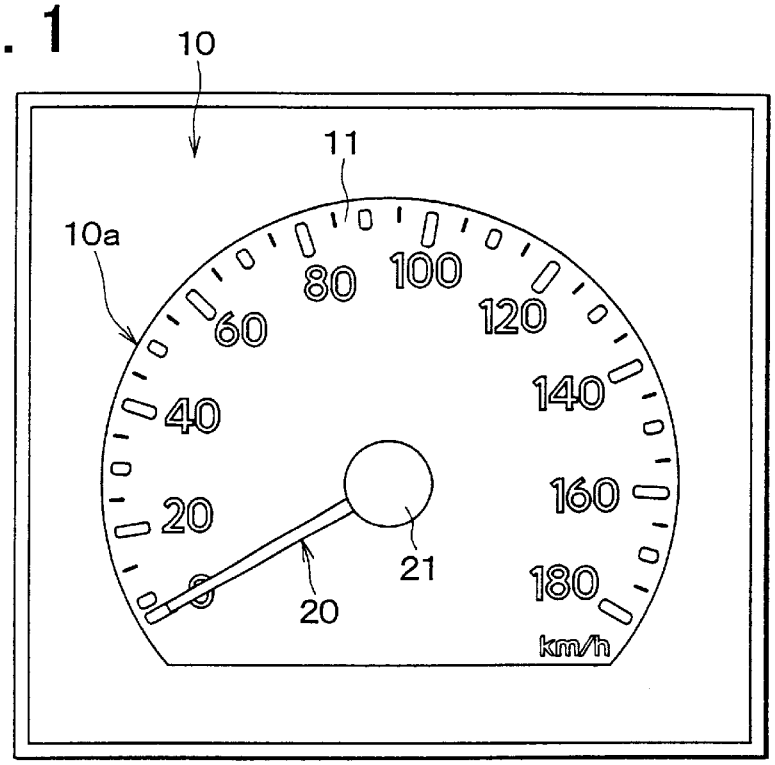
FIG. 1 is a plan view of a vehicle indication instrument according to a first embodiment of the invention.
Figure 2:
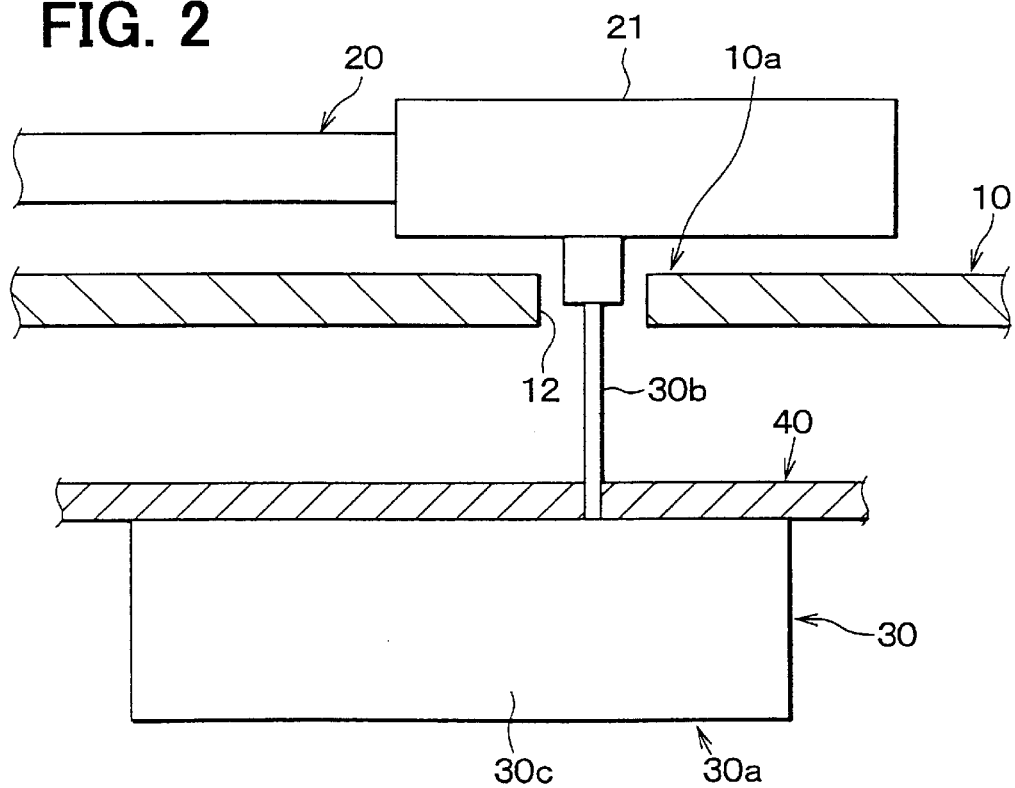
FIG. 2 is a fragmentary cross-sectional side view of the indication instrument shown in FIG. 1.

An indicating instrument for a vehicle according to a first embodiment of the invention is described with reference to FIGS. 1–9. The indication instrument according to the first embodiment includes a dial plate unit 10, a pointer 20 a drive unit 30 and a printed circuit board 40.

The dial plate unit 10 has a dial plate 10a, which has an arc-shaped vehicle speed display portion 11 that displays a vehicle speed between zero km/h and 180 km/h by an arc-shaped scale and a plurality of numerals disposed along the scale.

The pointer 20 has a boss portion 21 and swings over the display portion 11.

The drive unit 30 includes a driver 30a and a pointer shaft 30b. The driver section 30a is fixed to the back of the circuit board 40 at a position thereof corresponding to the dial plate 10a. The driver 30a is comprised of a casing 30c shown in FIG. 2, a two-phase step motor M shown in FIGS. 3–5, a speed reduction gear train G shown in FIG. 3 and a stopper unit S shown in FIG. 3. The speed reduction gear train G has an output gear 34 that is connected to the pointer shaft 30b at the center thereof. The driver 30a drives the pointer shaft 30b at a reduced speed that is proportional to the rotation speed of the step motor M, via the speed reduction gear train G. The casing 30c is fixed, at the top thereof, to the back of the circuit board 40. The pointer shaft 30b projects upward from the casing 30c and extends through a hole of the circuit board 40 and a hole 12 of the dial plate 10a. The circuit board 40 is disposed at the back of the dial plate unit 10 in parallel thereto.

The step motor M is comprised of a stator Ms and a magnet rotor Mr. The stator Ms is disposed in the casing 30c in parallel with the dial plate unit 10. The stator Ms is comprised of a yoke 31, a phase-A field coils 32 and a phase-B 33. The yoke 31 is comprised of a pair of stationary poles 31a and 31b. The stationary pole 31a has the phase-A field coil 32, and the stationary pole 32a has the phase-B field coil 33. The magnet rotor Mr is fixed to a rotary shaft 35a at the center thereof. The magnet rotor Mr has a plurality of N and S magnetic poles that is alternately formed on the circumference thereof. The magnet rotor Mr rotates one pole pitch of the magnetic poles each time. The rotary shaft 35a is rotatably supported by the opposite ends of the casing 30c to be in parallel with the pointer shaft 30b.

When cosine-wave voltage-signals having phases a certain angle (such as 90 degree) different from each other are respectively applied to the field coils 32 and 33, the pair of the stationary poles 31a and 31b provides a rotating magnetic field between the magnetic rotor Mr and the yoke 31.

The speed reduction gear train G includes, besides the output gear 34, an input gear 35 and a pair of medium gears 36 and 37. The pair of medium gear 36 and 37 is disposed in the casing 30c between the output gear 34 and the input gear 35 and is rotatably supported by a rotary shaft 36a that is supported by the opposite ends of the casing to be in parallel with the pointer shaft 30b. The medium gear 36 is in mesh with the output gear 34. The outside diameter of the medium gear 36 is smaller than the outside diameter of the medium gear 37 and also the outside diameter of the output gear 34. The input gear 35 is in mesh with the medium gear 37. The outside diameter of the input gear 35 is smaller than the outside diameter of the medium gear 37.

The stopper unit S has a strip-like stopper 38 and a L-shaped arm 39. The stopper 38 project from the front surface of the output gear 34 at the portion thereof that corresponds to the zero-position of the pointer 20. In other words, the stopper 38 is formed on the front surface of the output gear 34 in a radial direction thereof to project in parallel with the pointer shaft 30b.

Figure 3:
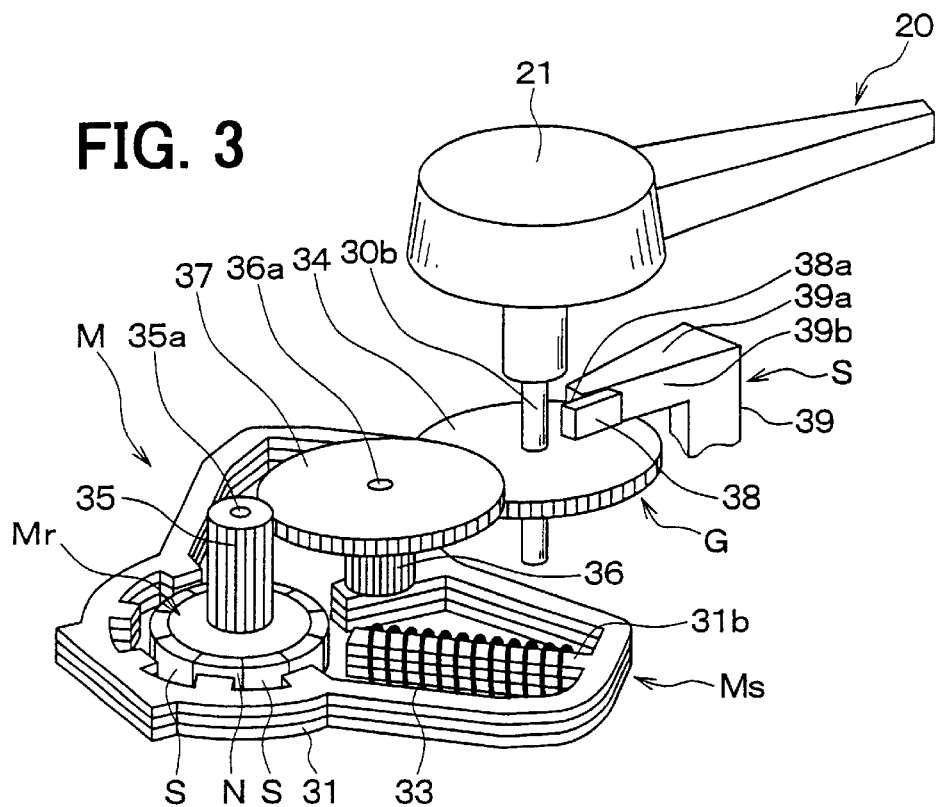
FIG. 3 is a perspective view illustrating a pointer, a drive unit, a step motor and a stopper unit of the indicating instrument for a vehicle according to the first embodiment.
Figure 4:
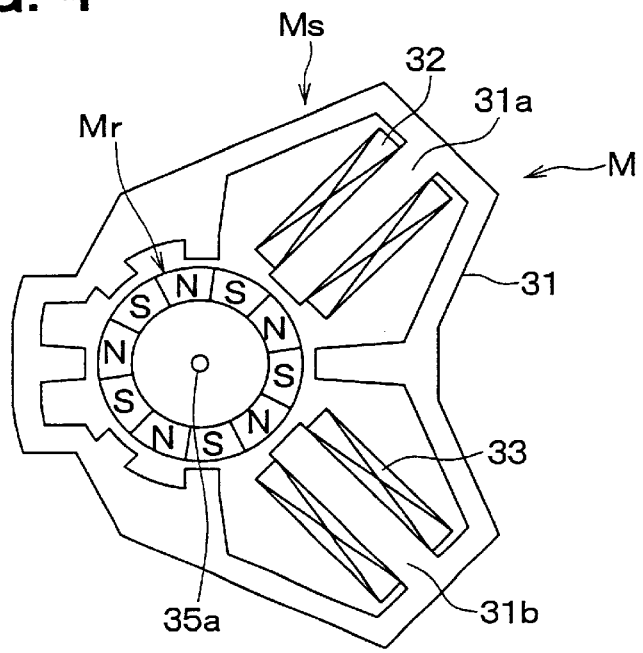
FIG. 4 is a plan view of the step motor shown in FIG. 3.

The arm 39 extends in parallel with the pointer shaft 30b from the bottom of the casing 30c just under the pointer 20 and bends so that the end portion 39a thereof extends in parallel with the surface of the output gear 34. The end portion 39a has a side surface 39b facing the zero-position of the pointer 20. If the pointer 20 reaches the zero-position by the reversal of the motor M, the stopper 38 abuts the side surface 39b, as shown in FIG. 3.

Figure 6:
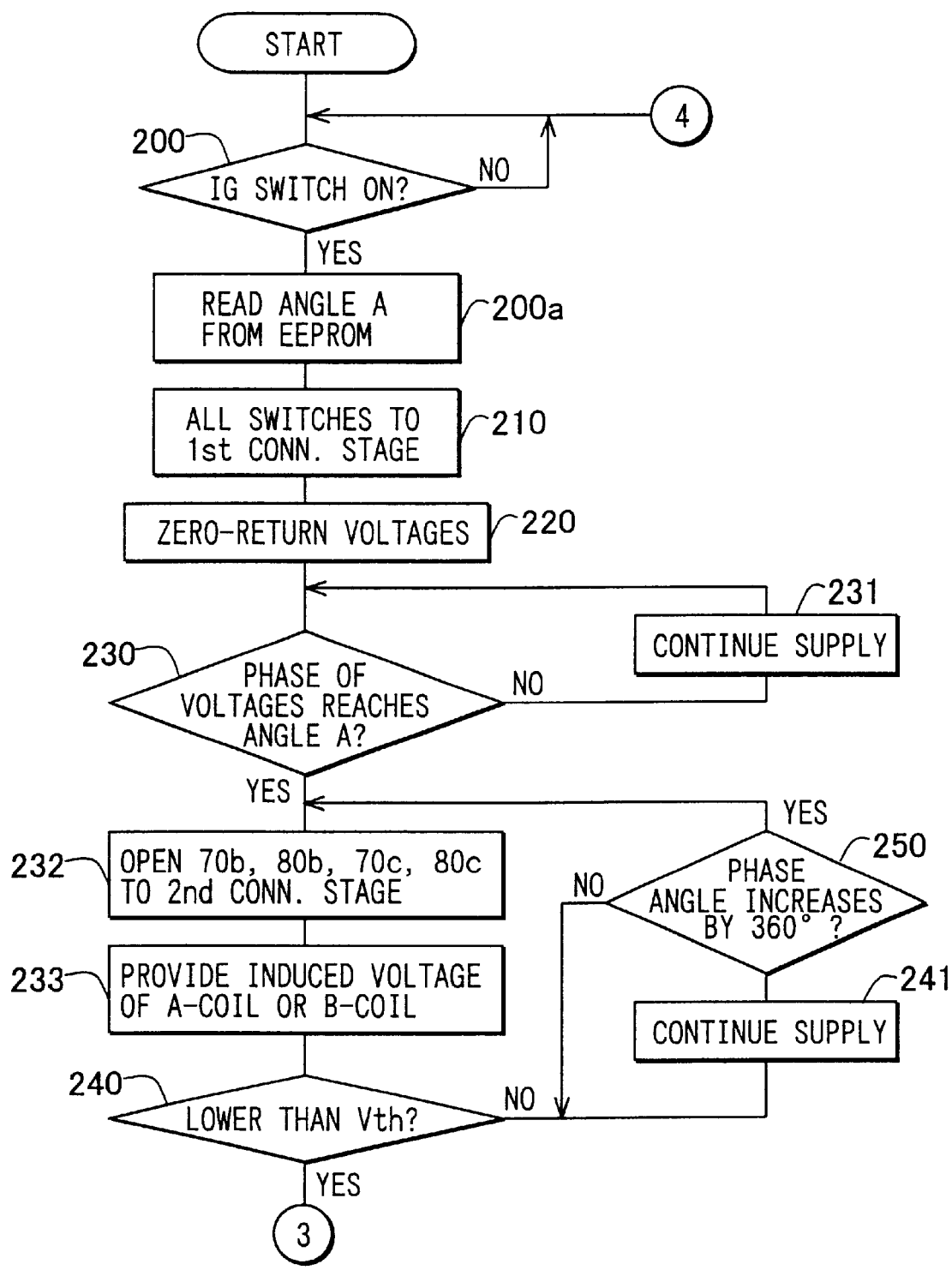
FIG. 6 is a flow diagram of the first half operation of the microcomputer shown in FIG. 5.
Figure 7:
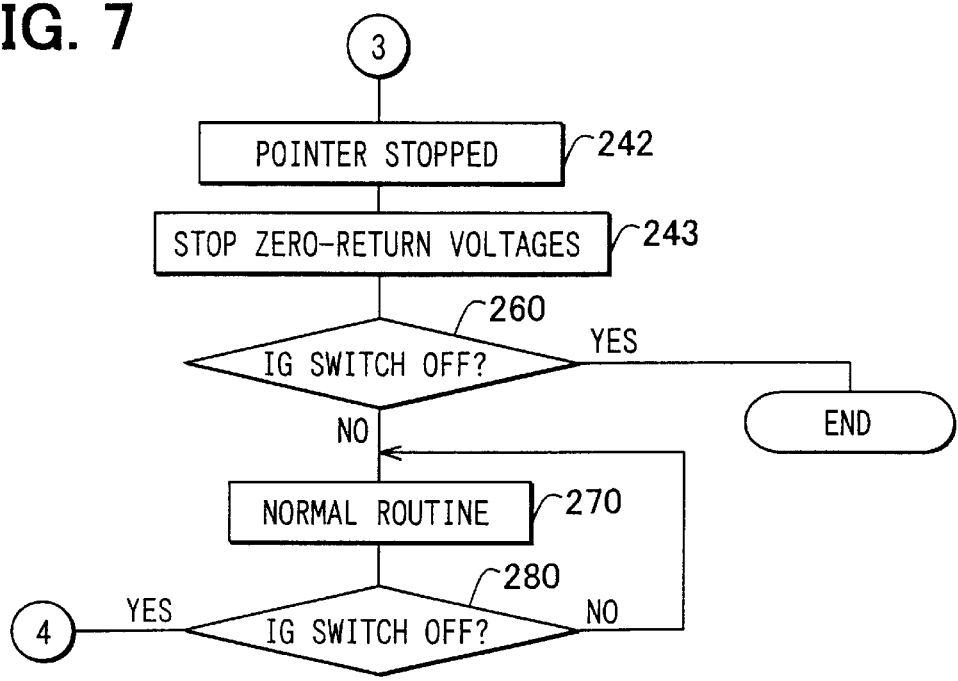
FIG. 7 is a flow diagram of the second half operation of the microcomputer shown in FIG. 5.

The microcomputer 50 executes the programs stored in a ROM thereof, as shown in FIGS. 6 and 7. The microcomputer 50 is directly powered by the battery B and controls the step motor M according to the output signal of a vehicle speed sensor 60 and the data previously stored by the EEPROM 90, via a pair of drivers 70 and 80.

The vehicle speed sensor 60 detects a vehicle speed. The driver 70 is comprised of a drive circuit 70a, a pair of change-over switches 70b and 70c. The drive circuit 70a is connected to the microcomputer 50 by a pair of its output terminals 51 and 52 and controlled by the microcomputer 50 to drive the phase-A field coil 32 via the pair of change-over switches 70b and 70c. The change-over switch 70b has a first stationary contacts 71, a second stationary contact 72 and a movable contact 73. The change-over switch 70c also has a first stationary contacts 74, a second stationary contact 75 and a movable contact 76. The first stationary contacts 71 and 74 provide a first connection statel when they are closed by the movable contacts 73 and 76.

The phase-A field coil 32 is connected between the movable contacts 73 and 76. The first stationary contact 71 of the change-over switch 70b and the first stationary contact 74 of the change-over switch 70c are respectively connected to output terminals of the drive circuit 70a. The second stationary contact 72 of the change-over switch 70b and the second stationary contact 75 of the change-over switch 70c are respectively connected to output terminals 55 and 56 of the microcomputer 50.

The driver 80 is comprised of a drive circuit 80a, a pair of change-over switches 80b and 80c. The drive circuit 80a is connected to the microcomputer 50 by a pair of its output terminals 53 and 54 and controlled by the microcomputer 50 to drive the phase-B field coil 33 via the pair of change-over switches 80b and 80c. The change-over switch 80b has a first stationary contacts 81, a second stationary contact 82 and a movable contact 83. The change-over switch 80c also has a first stationary contacts 84, a second stationary contact 85 and a movable contact 86. The first stationary contacts 81 and 84 provide a first connection state when they are closed by the movable contacts 83 and 86.

The phase-B field coil 32 is connected between the movable contacts 83 and 84. The first stationary contact 81 of the change-over switch 80b and the first stationary contact 84 of the change-over switch 80c are respectively connected to output terminals of the drive circuit 80a. The second stationary contact 82 of the change-over switch 80b and the second stationary contact 85 of the change-over switch 80c are respectively connected to output terminals 57 and 58 of the micro computer 50.

The phase-A field coil 32 and the phase-B field coil 33 are driven by cosine-wave alternating voltage signals that are 90 degree different in phase from each other.

Figure 5:
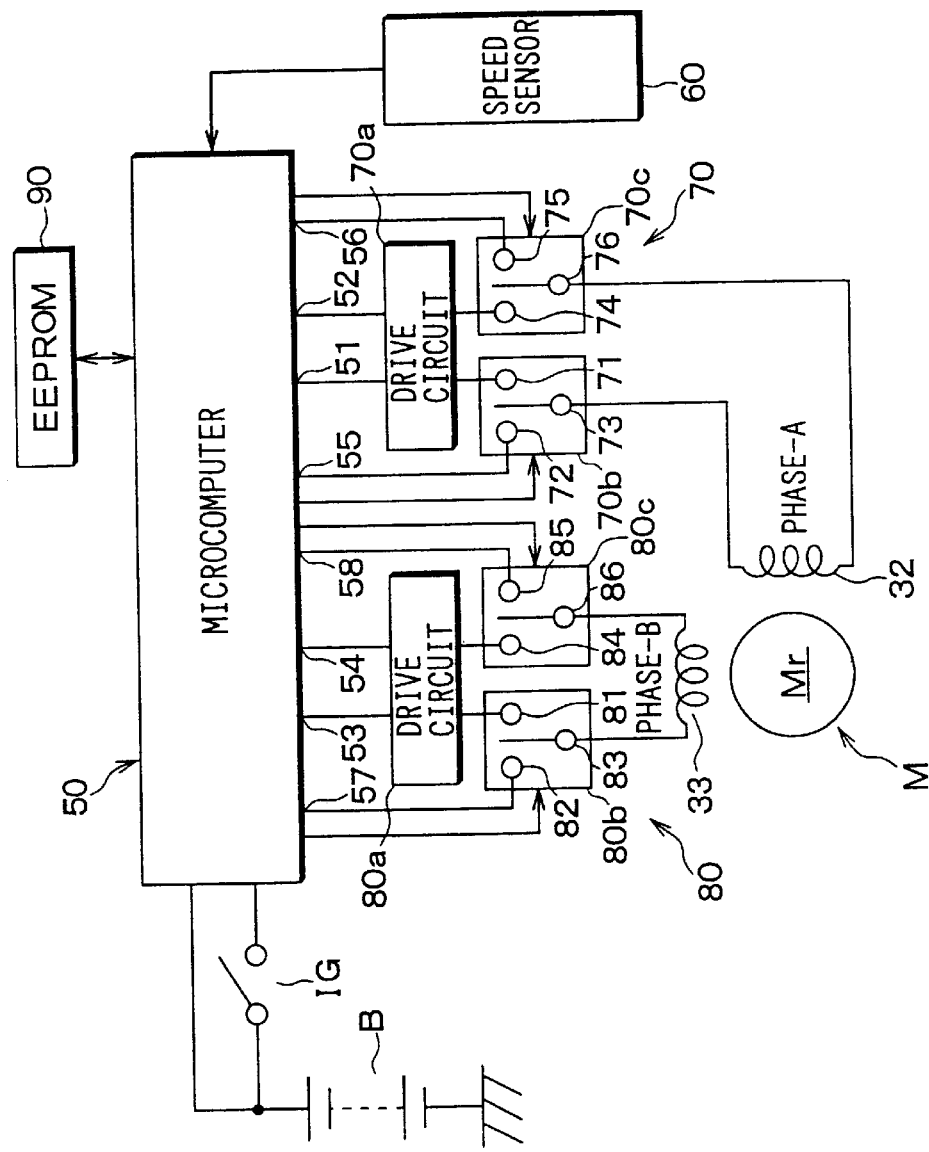
FIG. 5 is an electric circuit diagram of the indicating instrument according to the first embodiment.
Figure 9:
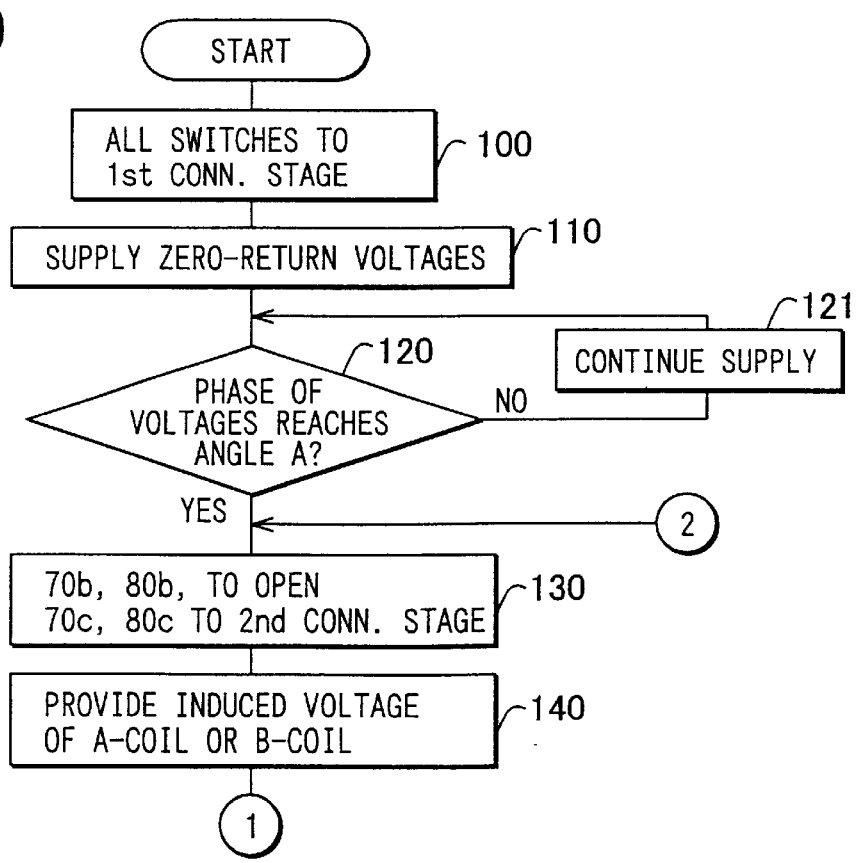
FIG. 9 is a flow diagram of the first half portion of a write program executed by the microcomputer shown in FIG. 8.
Figure 8:
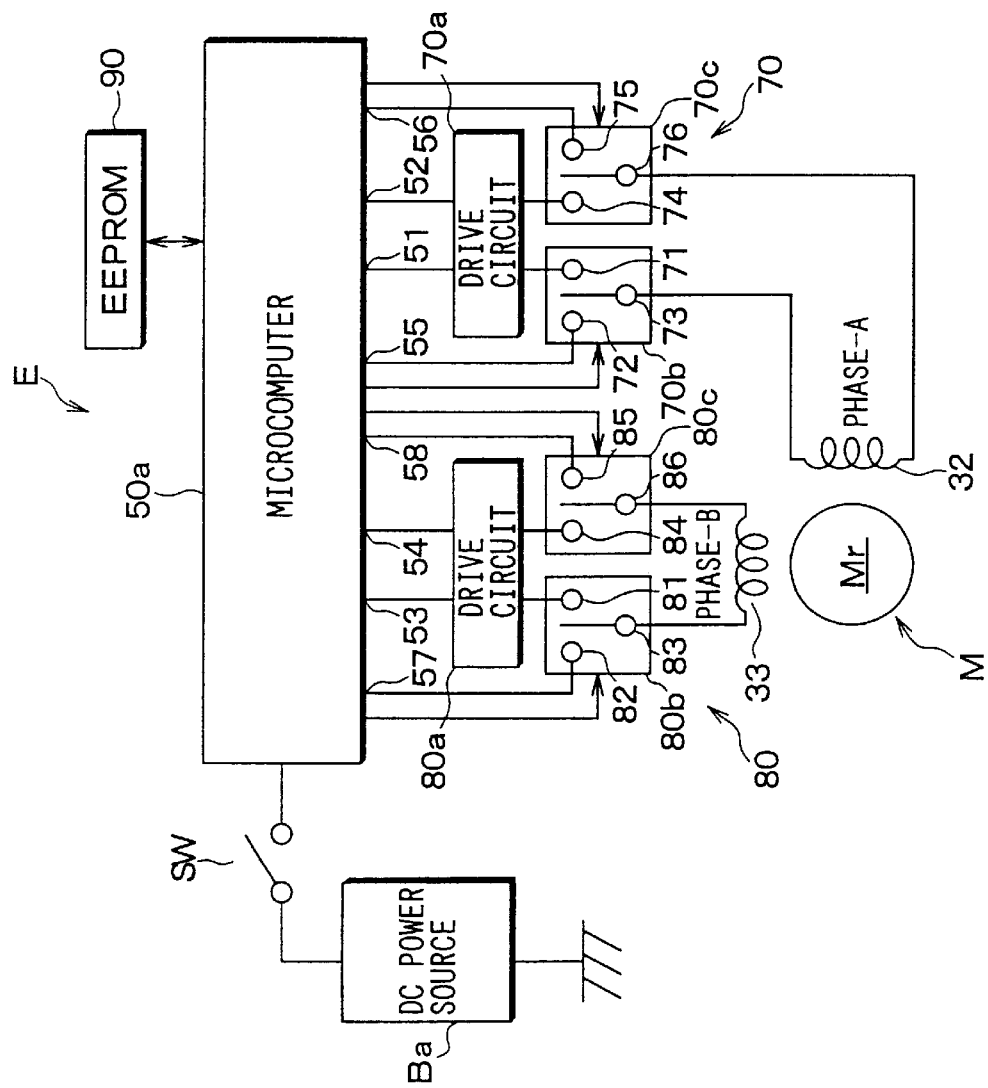
FIG. 8 is a circuit diagram of a write circuit for the EEPROM shown in FIG. 5.
Figure 10:
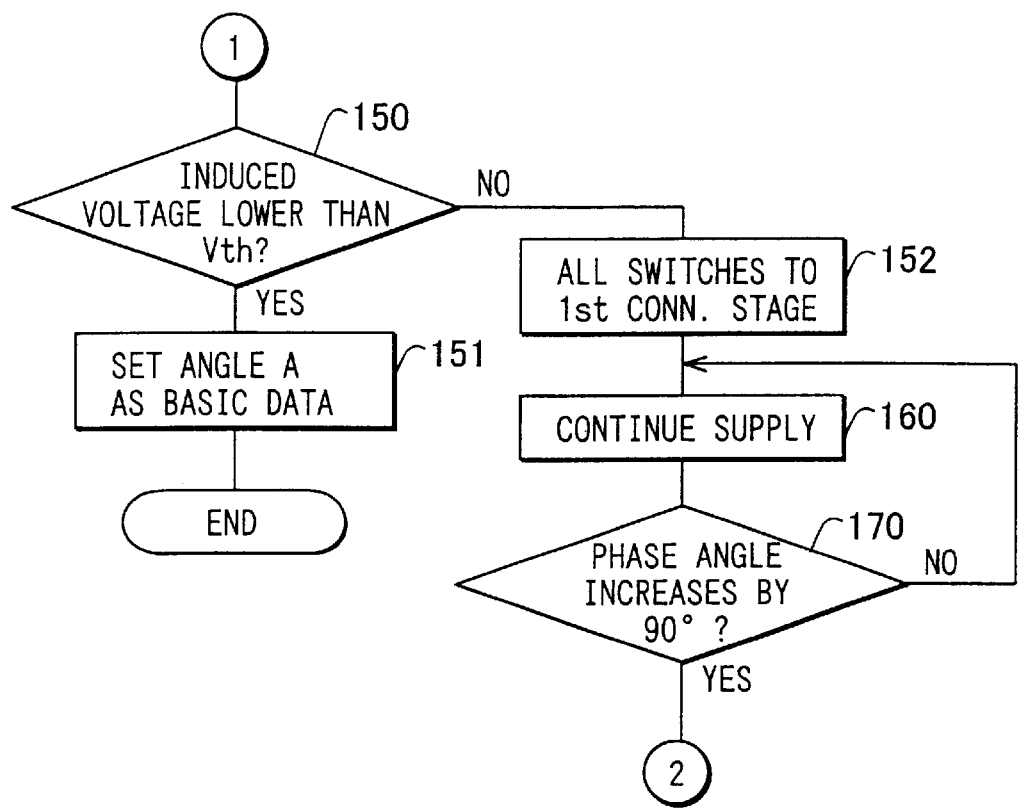
FIG. 10 is a flow diagram of the second half portion of the write program executed by the microcomputer shown in FIG. 8.

Basic data for judging whether the pointer 20 reaches the zero-position or not are stored in the EEPROM 90 by a writing circuit E equipped in a factory, service shop or the like, as shown in FIG. 8, which is similar to the circuit shown in FIG. 5. The writing circuit E is comprised of a microcomputer 50a and an operation switch SW. When the operation switch SW is turned on, the microcomputer 50a executes a writing program shown in FIGS. 9 and 10 which includes a step of driving the step motor M by the drivers 70 and 80 to the zero-position and a step of outputting the basic data. As shown in FIG. 9, all the first stationary contacts 71, 74, 81 and 84 are turned on to respectively provide first connection states by the movable contacts 73, 76, 83 and 86 at step 100. Accordingly, the phase-A field coil 32 is connected to the drive circuit 70a, and the phase-B field coil 33 is connected to the drive circuit 80a.

Figure 11:
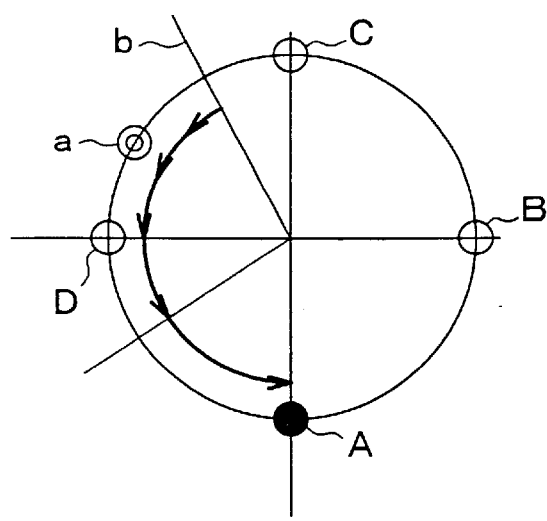
FIG. 11 is a diagram explaining how to write basic data to the EEPROM.
Figure 13:
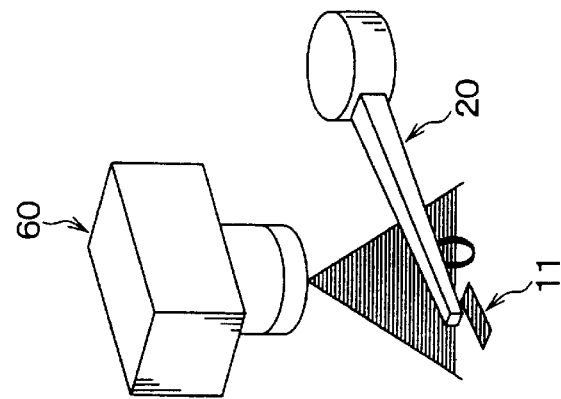
FIG. 13 is a schematic perspective view illustrating a camera used in the write circuit shown in FIG. 12.

At step 110, zero-return alternating voltages are respectively applied to the phase-A field coil 32 and the phase B field coil. The zero-return alternating voltages are cosine-wave signals to be combined to reverse the step motor. Each zero-return alternating voltage alternately becomes zero, so that the zero level is given at every 90-degree phase angle (at one of angular positions A–D), as shown in FIG. 11, in which the stopper unit S is located at point a.

Thereafter, the phase-A zero-return alternating voltage is applied from the microcomputer 50a to the phase-A field coil 32 by the drive circuit 70a via the change-over switches 70b and 70c at a point b, which is shifted clockwise from the point a. At the same time, the phase-B zero-return alternating voltage is applied from the microcomputer 50a to the phase-B field coil 33 by the drive circuit 80a via the change-over switches 80b and 80c.

Accordingly, the magnet rotor Mr reverses, and the drive unit 30 drives the pointer 20 toward the zero-position. The rotation angle of the pointer 20 is set to relate to the phase angle of the phase-A zero-return alternating voltage and the phase-B zero-return alternating voltage.

At step 120, the phase angle of the phase-A zero-return alternating voltage or the phase-B zero-return alternating voltage is examined whether the phase angle thereof reaches electric angle A via electric angle D. If the result of the examination is NO, both the zero-return alternating voltages are further applied to reverse the magnet rotor Mr until the result of the examination becomes YES.

When the result of the examination at the step 120 is YES, both the change-over switches 70*b* and 80*b* are opened and the second contacts 75 and 85 of the change-over switches 70*c* and 80*c* are connected to the phase-B field coil 33 to provide second connection states. Accordingly, an end of the phase-A field coil 32 is opened and the other end is connected to the output terminal 56 of the microcomputer 50*a*, and an end of the phase-B field coil 33 is opened and the other end is connected to the output terminal 58 of the micro computer 50*a*. As a result, a voltage is induced in the phase-A field coil 32 and in the phase-B coil 33.

At step 140, the voltages induced in the phase-A field coil 32 and the phase-B field coil 33 are inputted into the microcomputer 50*a*. At step 150 shown in FIG. 10, whether the inputted voltage is lower than a threshold voltage Vth or not is examined. The threshold voltage Vth is selected as low as zero volt because the phase-A return voltage, which is a cosine wave signal, changes sharply around its zero-level voltage. In addition, the voltage induced in the phase-A field coil is zero when the pointer 20 and the magnet rotor Mr are stopped by the stopper unit, because the magnet rotor Mr does not cross the phase-A field coil 32.

If the induced voltage is equal to or lower than the threshold voltage Vth, the result of the step 150 is YES. Consequently, the phase angle A is outputted and written to the EEPROM 90 as the basic data at step 151. If, on the other hand, the result of the step 150 is NO, all the change-over switches 70*b*, 70*c*, 80*b* and 80*c* are changed to provide the first connection states at step 152.

Then, at step 160, the phase-A and phase-B zero-return alternating voltages are outputted continuously to further reverse the magnet rotor Mr. After the phase of the zero-return alternating voltages increases by 90 degree in electric angle, YES is outputted at step 170 so that the steps following the step 130 are carried out. Thereafter, if the result of the examination at the step 150 is YES, the electric angle B is outputted as the basic data and is inputted to the EEPROM 90 in place of the electric angle A. Then, the write process of the EEPROM 90 ends.

If the result of the examination at the step 170 is YES and the subsequent result of the examination at the step 150 is NO, the electric angle C or D may be written to the EEPROM as the basic data. Thus, the basic data are written into the EEPROM 90.

If the electric angle A is written into the EEPROM 90, the microcomputer 50 of the indicating instrument according to the first embodiment of the invention, shown in FIG. 5, operates as follows.

When the microcomputer 50 of the indicating instrument having the EEPROM 90 to which the electric angle A has been written is powered by the battery B, the microcomputer 50 executes the computer program according to the flow diagrams shown in FIGS. 6 and 7. If the ignition switch IG is turned off, the step 200 repeatedly provides NO. If the ignition switch IG, thereafter, turned on, the step 200 provides YES so that the microcomputer 50 reads the basic data representing the angle A from the EEPROM 90 at step 200*a*.

At step 210, all the change-over switches 70*b*, 70*c*, 80*b* and 80*c* are changed to the first connection state.

At step 220, the phase-A zero-return alternating voltage and the phase-B zero-return alternating voltage are outputted to the respective drive circuits 70*a* and 80*a*. Consequently, the drive circuit 70*a* supplies the phase-A field coil 32 with the phase-A zero-return alternating voltage via the change-over switches 70*b* and 70*c*, and the drive circuit 80*a* supplies the phase-B field coil with the phase-B zero-return alternating voltage via the change-over switches 80*b* and 80*c*. Accordingly, the rotating magnetic field is formed by the phase-A field coil 32 and the phase-B field coil 33, so that the drive unit 30 rotates the pointer 20 toward the zero-position.

At step 230, whether the phase-A zero-return alternating voltage and the phase-B zero-return alternating voltage reach the phase angle A or not is examined. If the result is NO, both the zero-return alternating voltages are still supplied to the coils 32 and 33 continuously to reverse the magnet rotor Mr further.

If the result of the step 230 is YES, the change-over switches 70*b* and 80*b* are opened, and the change-over switches 70*c* and 80*c* are changed to the second connection state at step 232. Thus, an end of the phase-A field coil 32 is disconnected and the other end thereof is connected to the output terminal 56 of the microcomputer 50 via the second stationary contact 75 and the movable contact 76, and an end of the phase-B field coil 33 is disconnected and the other end thereof is connected to the output terminal 58 of the microcomputer 50 via the second stationary contact 85 and the movable contact 86. Therefore, voltages are induced in the phase-A field coil 32 and the phase-B field coil. At step 233, the induced voltages are inputted to the microcomputer 50 from the phase-A field coil 32 and the phase-B field coil 33. At step 240, whether the induced voltage is equal to or lower than the threshold voltage Vth or not is examined.

If the result of the step 240 is NO, it is presumed that the pointer 20 does not reach the zero-position. Therefore, the phase-A zero-return alternating voltage and phase-B zero-return alternating voltage are still supplied to the coils 32 and 33 to further reverse the magnet rotor Mr. At step 250, whether the phase-A zero-return alternating voltage and the phase-B zero-return alternating voltage go through another 360-degree in phase or not is examined. If the result of the step 250 is NO, step 241 and step 250 are repeated until the result of the step 250 changes to YES.

If the result of the step 240 is YES, it is presumed that the pointer 20 is stopped by the stopper unit S. Accordingly, the zero-return alternating voltages are stopped at step 243.

The electric angle A is written into the EEPROM beforehand, and, then, the phase-A zero-return alternating voltage and the phase-B zero-return alternating voltage are judged that the phase angles thereof reach the electric angle A at the step 230. Thereafter, if the voltages induced in the phase-A field coil 32 and the phase-B field coil 33 are judged higher than the threshold voltage Vth at the step 240, it is judged that the pointer 20 is stopped by the stopper unit S at the step 242. Even if the voltage induced in the phase-A field coil 32 or phase-B field coil is lower than the threshold voltage Vth, the above judgement is not carried out unless the phase angles of the phase-A zero-return alternating voltage and the phase-B zero-return alternating voltage reach the electric angle A. However, the basic data can be substituted by the electric angle B, C or D in the same manner as described above. After the step 243, whether the ignition switch Ig is turned off or not is examined at step 260. If the ignition switch Ig is turned off, the result of the step 260 is YES to end the operation of the microcomputer 50.

If the result of the step 260 is NO, the computer program proceeds to a normal routine at step 270, and the microcomputer 50 changes the change-over switches 70b, 70c, 80b and 80c to the first connection state and outputs the phase-A drive voltage and the Phase-B drive voltage according to the signal of the vehicle speed sensor 60.

The drive circuit 70a supplies the phase-A drive voltage to the phase-A field coil 32, and the drive circuit 80a supplies the phase-B drive voltage to the phase-B field coil 33. Therefore, the drive unit 30 drive the pointer 20 according to the signal of the vehicle speed sensor 60 to indicate a vehicle speed on the vehicle speed display portion 11 of the dial plate 10a.

If the ignition switch Ig is turned on to provide the step 280 with YES while the normal routine 270 is being carried out, the operation of the microcomputer 50 returns to the step 200. The drive voltages and the zero-return alternating voltages are not limited to cosine-wave voltages. Another alternating wave voltage, such as a sine-wave voltage, a trapezoidal wave voltage, a triangular voltage or the like, can be also used as the drive voltage or the zero-return alternating voltage.

Another writing circuit E1 with the operation thereof is described with reference to FIGS. 12–22. In the meantime, the same reference numeral in the figures represents the same or substantially the same part, component or portion as the above-described writing circuit E, hereafter.

Figure 12:
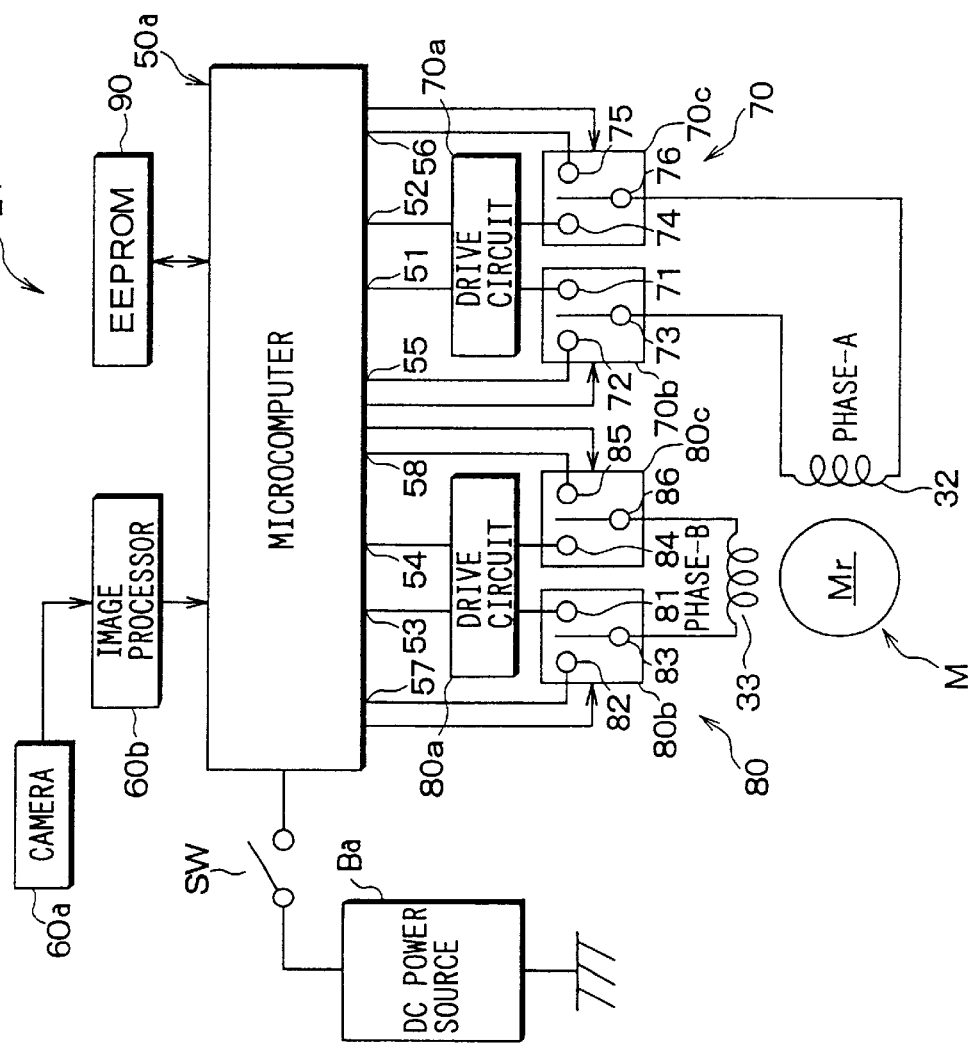
FIG. 12 is a modified circuit diagram of a write circuit of the EEPROM.

The writing circuit E1 has a camera 60a and an image processing circuit 60b in addition to the structure of the writing circuit E according to the first embodiment, as shown in FIG. 12. The image processing circuit 60b outputs an image signal representing a position of the speed display portion 11 to be inputted to the microcomputer 50a.

Basic data for judging whether the pointer 20 reaches the zero-position or not are stored in the EEPROM 90 by a writing circuit E1, as shown in FIG. 12.

Figure 14:
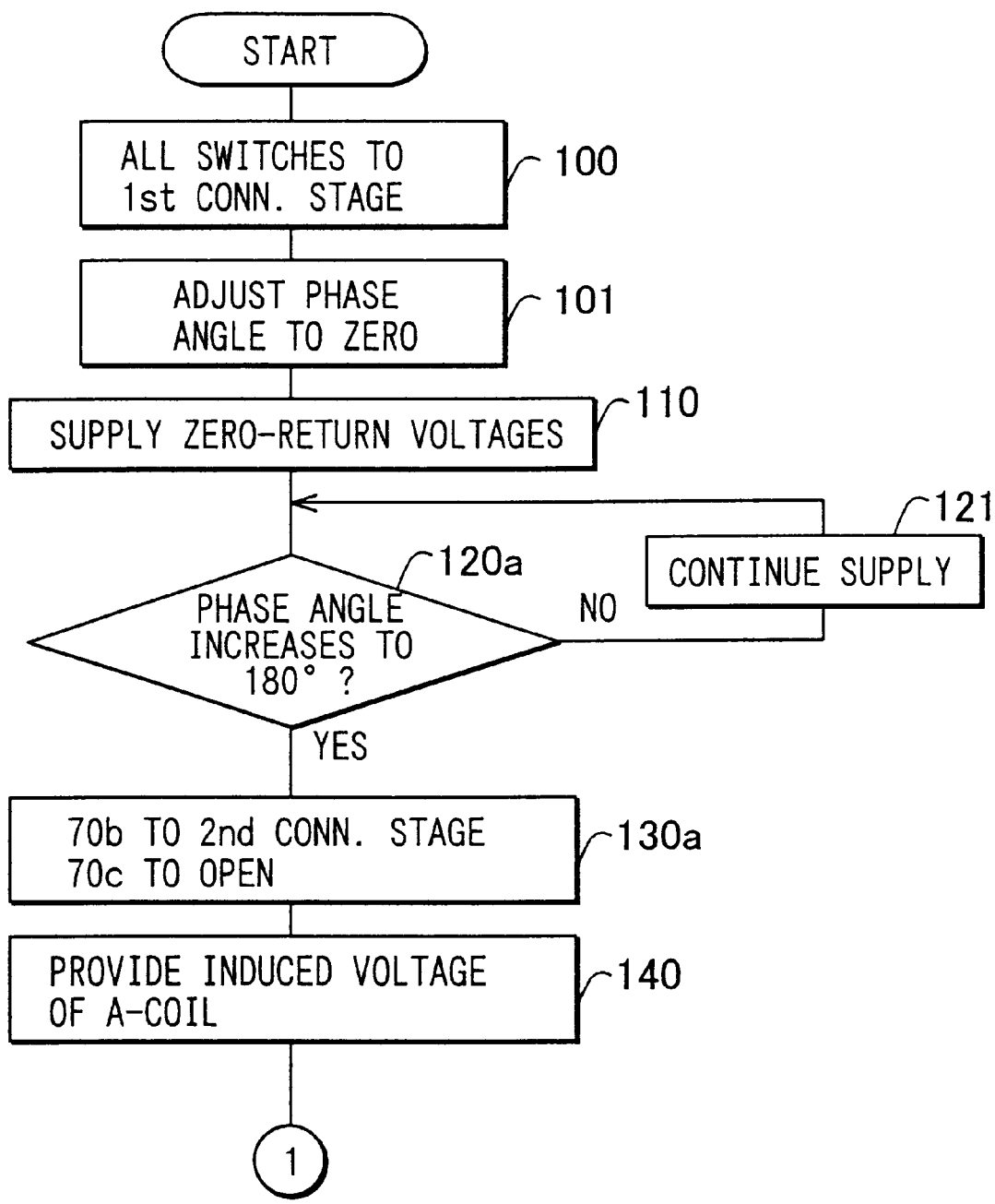
FIG. 14 is a flow diagram of a portion of a write program executed by a microcomputer used in the write circuit shown in FIG. 12.
Figure 15:
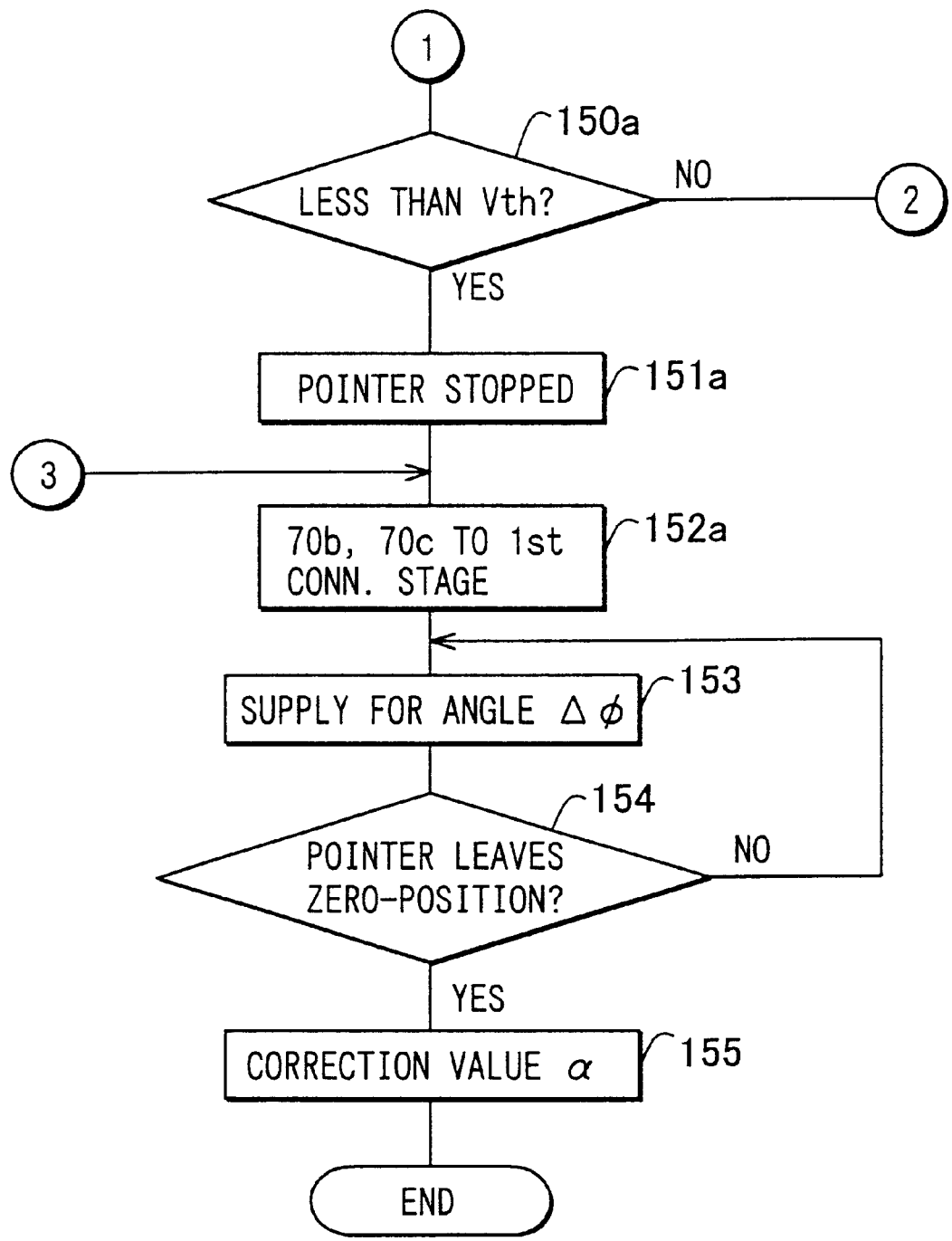
FIG. 15 is a flow diagram of a portion of the write program executed by the microcomputer used in the write circuit shown in FIG. 12.

When the operation switch SW is turned on, the microcomputer 50a executes writing programs shown in FIGS. 14–19. As shown in FIG. 14, all the first stationary contacts 71, 74, 81 and 84 of the change-over switches 70b, 70c, 80b and 80c are turned on to respectively provide first connection states by the movable contacts 73, 76, 83 and 86 at step 100. Accordingly, the phase-A field coil 32 is connected to the drive circuit 70a, and the phase-B field coil 33 is connected to the drive circuit 80a.

At step 101, the phase angles of the zero-return alternating voltages are adjusted as follows. The drive circuit 70a is controlled to supply the stationary contact 71 of the change-over switch 70b with a low level voltage and supply the stationary contact 74 of the change-over switch 70c with a high level voltage. At the same time, the drive circuit 80a is controlled to supply the stationary contact 81 of the change-over switch 80b and the stationary contact 85 of the change-over switch 80c with a low level voltage. Accordingly, the phase of the zero-return alternating voltages to be applied to the phase-A and phase-B field coils 32 and 33 is adjusted to zero phase angle.

At step 110, the zero-return alternating voltages are respectively supplied to the phase-A field coil 32 and the phase B field coil. The zero-return alternating voltages are cosine-wave signals to be combined to reverse the step motor, as described above.

At step 120a, whether the phase angle of both the phase-A and the phase-B zero-return alternating voltages increases to 180 degree or not is examined. If the result of the step 120a is NO, both the zero-return alternating voltages are still supplied to the coils 32 and 33 continuously to reverse the magnet rotor Mr further at step 121 until the result of the step 120a becomes YES. In the meantime, the angle 180 degree corresponds to a half cycle of the phase-A or phase-B zero-return alternating voltage.

If the result of the step 120a is YES, the change-over switch 70b is changed to the second connection state and the change-over switch 70c is opened at step 130a. Accordingly, an end of the phase-A field coil 32 is disconnected and the other end thereof is connected to the output terminal 55 of the microcomputer 50a, so that a voltage is induced by the magnet rotor Mr in the phase-A field coil 32, which is inputted to the microcomputer 50a, at the step 140. Subsequently, the induced voltage is examined whether it is equal to or lower than the threshold voltage Vth or not at the step 150.

Figure 20:
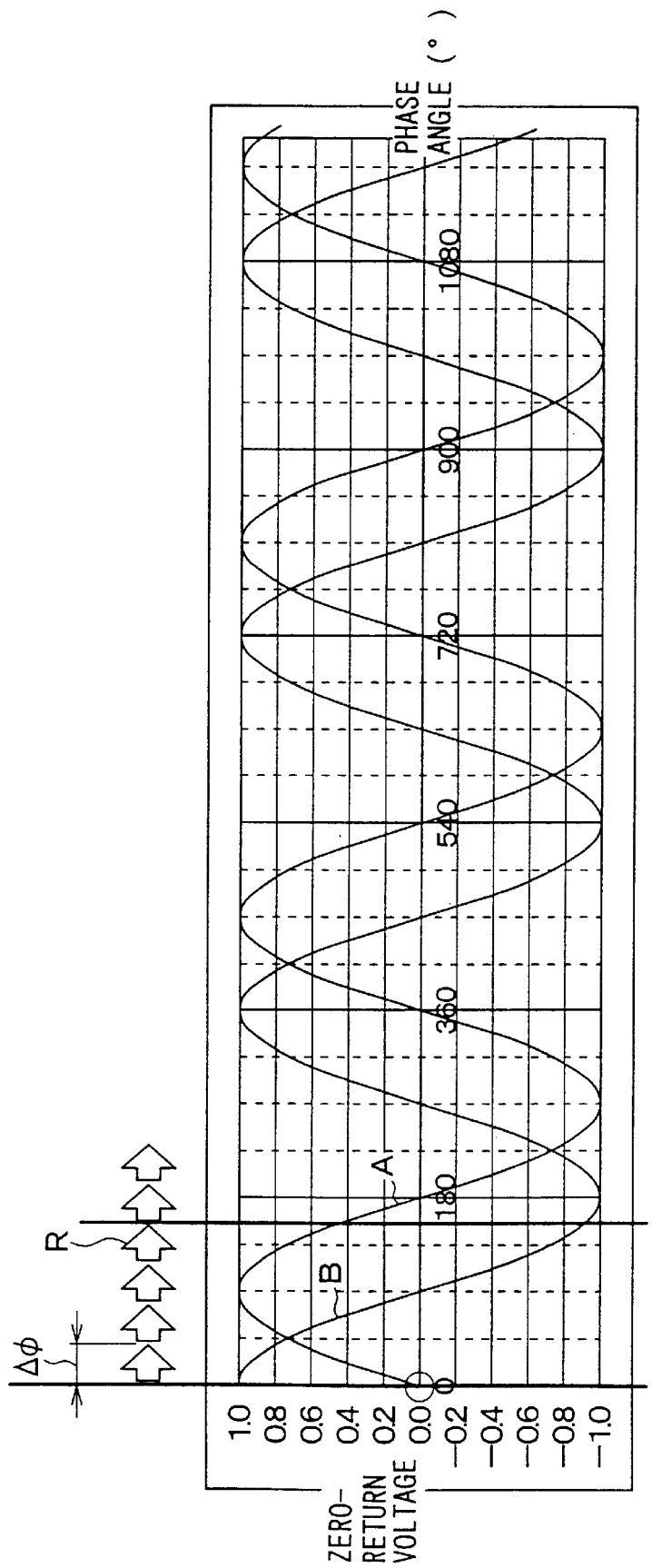
FIG. 20 is a timing chart of a pair of zero-return alternating signals.

If the induced voltage is lower than the threshold voltage Vth, it is presumed that the pointer 20 is stopped by the stopper unit S as described before. Thereafter, both the change-over switches 70b and 70c are changed to the first connection state at step 152a. Subsequently, the microcomputer 50a provides a portion of the phase-A and phase-B cosine wave drive voltages that corresponds to a predetermined phase-angle $\Delta\phi$ at step 153. The predetermined phase-angle $\Delta\phi$ corresponds to 24 degree phase angle, as shown in FIG. 20, and is a little larger than the resolution of the camera 60a.

When the drive circuits 70a and 80a respectively supply the phase-A and phase-B field coils with the phase-A and the phase-B drive voltages for a period that corresponds to the phase-angle $\Delta\phi$ via the change-over switches 70b, 70c, 80b and 80c, the magnet rotor Mr rotates so that the pointer 20 is driven by the speed reduction gear train to leave the zero-position. The motion of the pointer 20 is monitored by the camera 60a, processed by the image processor 60b and inputted to the microcomputer 50a.

If the pointer 20 does not leave the zero-position, step 154 provides NO, the step 153 repeats until the step 154 provides YES. Therefore, the pointer 20 is further driven to leave the zero-position. If the pointer 20 leaves the zero-position at the fifth supply period of the drive voltages that corresponds to the phase-angle $\Delta\phi$, this motion is inputted to the microcomputer 50a and the step 154 provides YES.

Then, the phase angle of the drive voltages just before the pointer leaves is set as a zero-position correction value $\alpha$ at step 155 and is stored into the EEPROM 90. In this preferred embodiment, the phase angle that corresponds to the fourth supply period is set as the zero-position correction value $\alpha$.

Figure 16:
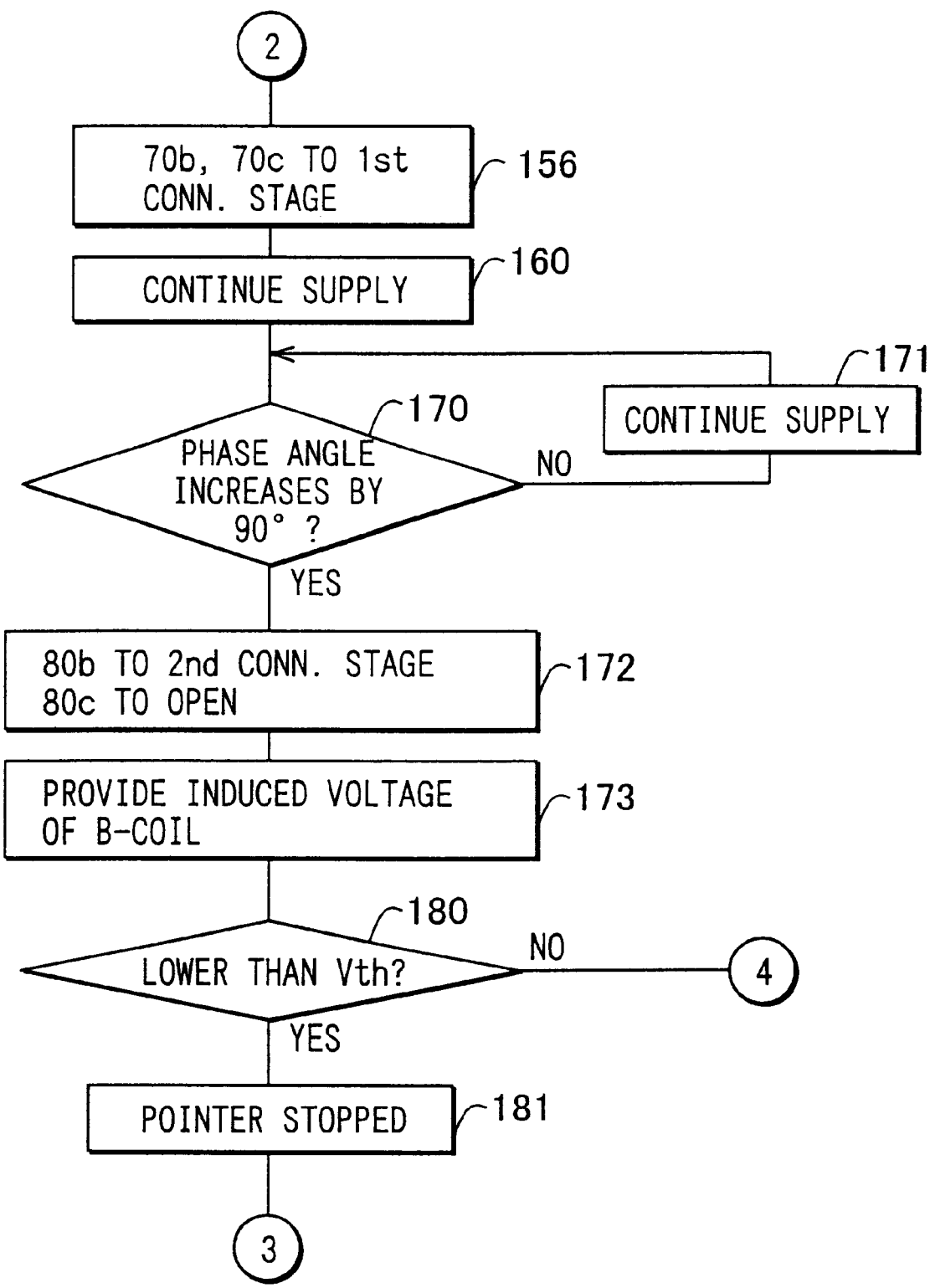
FIG. 16 is a flow diagram of a portion of the write program executed by the microcomputer used in the write circuit shown in FIG. 12.

If the induced voltage is higher than the threshold voltage Vth and, accordingly, the result of the step 150a is NO, step 156 and the steps following the step 156 are carried out, as shown in FIG. 16.

That is, both the change-over switches 70b and 70c are changed to the first connection state at the step 156 and supply of both the zero-return alternating voltages is continued, at step 160. Therefore, the magnet rotor Mr is further reversed by the microcomputer 50a.

Thereafter, whether the phase angle of the phase-A and phase-B zero-return alternating voltages increases by another 90 degree or not is examined at step 170. If the result is NO, supply of the zero-return alternating voltages is continued at step 171 to further reverse the magnet rotor Mr. If the result is YES, the change-over switch 80b is changed to the second connection state, and the change-over switch 80c is opened at step 172. Therefore, the phase-B field coil is opened at one end and connected to the output terminal 57 of the microcomputer 50a so that a voltage is induced in the phase-B field coil.

Subsequently, the induced voltage induced in the phase-B field coil 33 is inputted to the microcomputer 50a at step 173 and examined whether the induced voltage is equal to or lower than the threshold voltage Vth or not at step 180.

If the result of the step 180 is YES, it is presumed that the pointer 20 is stopped by the stopper unit S at step 181. After the step 181, the steps 152a-155 follow to provide the correction value α, which are described above.

Figure 17:
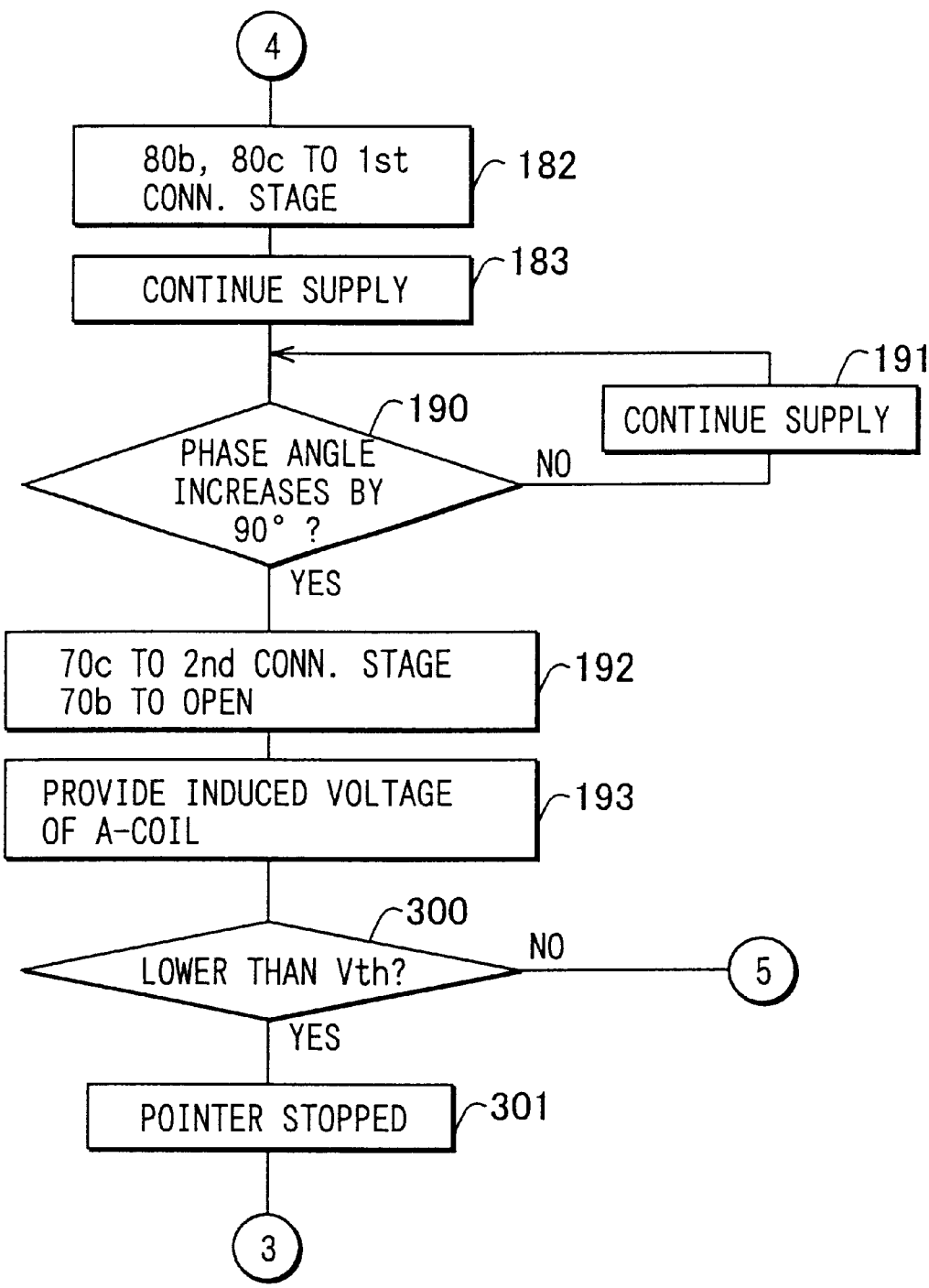
FIG. 17 is a flow diagram of a portion of the write program executed by the microcomputer used in the write circuit shown in FIG. 12.
Figure 18:
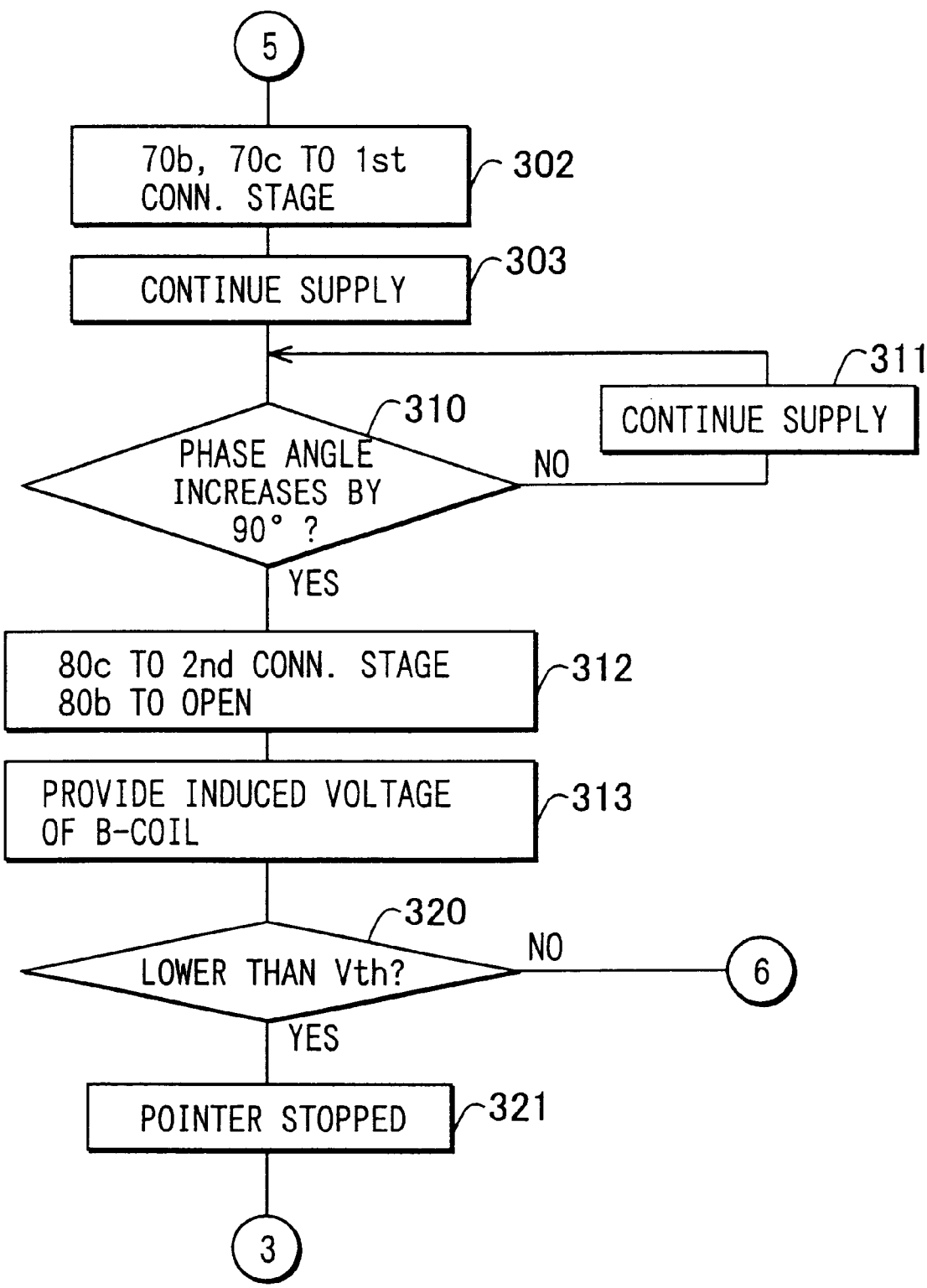
FIG. 18 is a flow diagram of a portion of the write program executed by the microcomputer used in the write circuit shown in FIG. 12.
Figure 19:
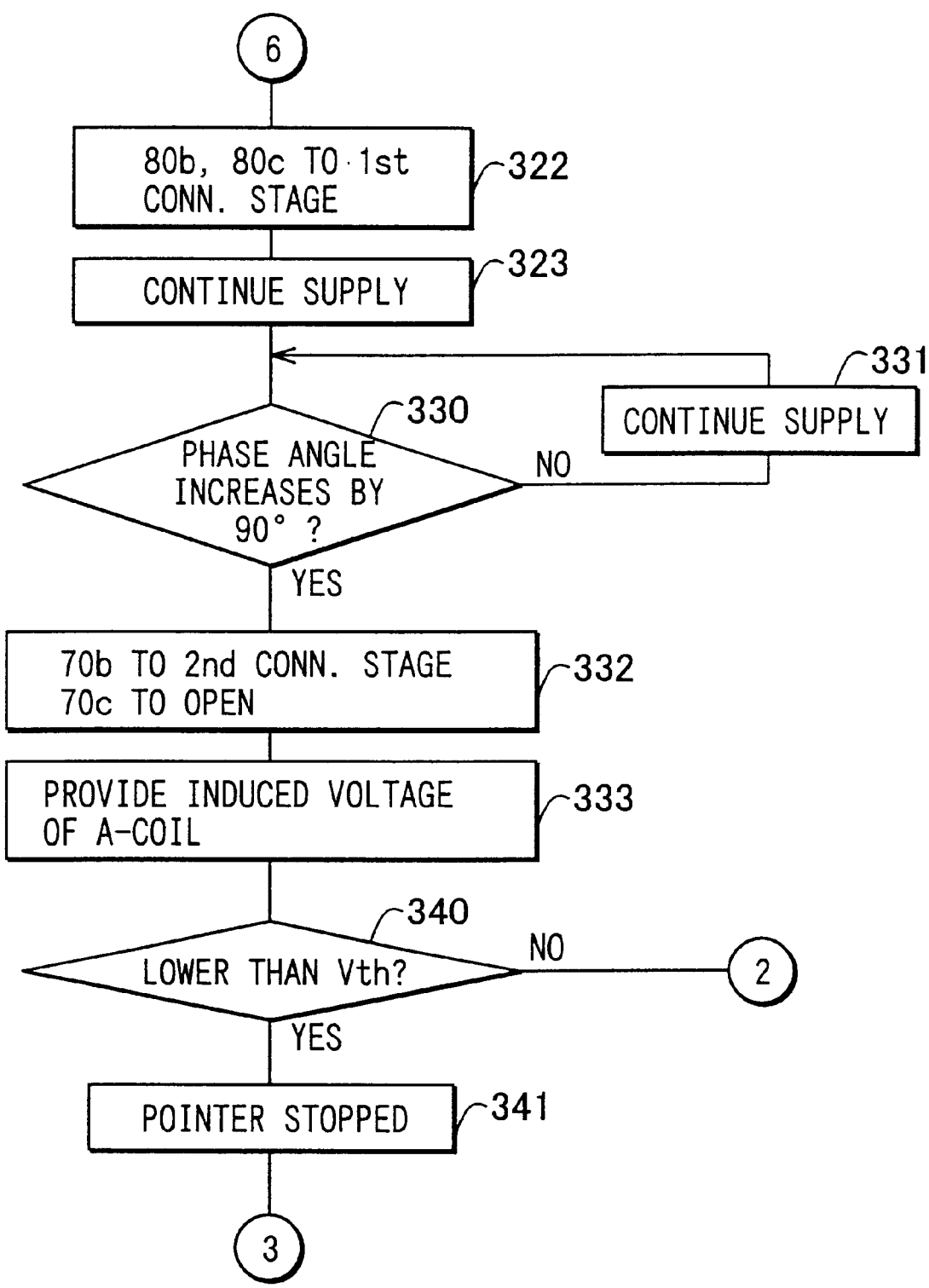
FIG. 19 is a flow diagram of a portion of the write program executed by the microcomputer used in the write circuit shown in FIG. 12.

On the other hand, if the result of the step 180 is NO, the computer program is carried out at step 182 and at the following steps shown in FIG. 17. At the step 182, the change-over switches 80b and 80c are changed to the first connection state. Therefore, the magnet rotor Mr of the magnet rotor Mr is further reversed by the microcomputer 50a.

Thereafter, whether the phase angle of the phase-A and phase-B zero-return alternating voltages increases by another 90 degree or not is examined at step 190. If the result is NO, supply of the zero-return alternating voltages is continued at step 191 to further reverse the magnet rotor Mr. If the result of the step 190 is YES, the change-over switch 70c is changed to the second connection state, and the change-over switch 70b is opened at step 192. Therefore, the phase-A field coil is opened at one end and connected to the output terminal 56 of the microcomputer 50a so that a voltage is induced in the phase-A field coil.

Subsequently, the induced voltage induced in the phase-A field coil 33 is inputted to the microcomputer 50a at step 193 and examined whether the induced voltage is equal to or lower than the threshold voltage Vth or not at step 300.

If the result of the step 300 is YES, it is presumed that the pointer 20 is stopped by the stopper unit S at step 301. After the step 301, the steps 152a-155 follow to provide the correction value α, which are described above. On the other hand, if the result of the step 300 is NO, it is presumed that the pointer 20 has not reached the zero-position. Therefore, the computer program proceeds to step 302 shown in FIG. 18.

At the step 302, the change-over switches 70b and 70c are changed to the first connection state. Thereafter, the magnet rotor Mr of the magnet rotor Mr is further reversed by the computer 50a at step 303. Subsequently, whether the phase angle of the phase-A and phase-B zero-return alternating voltages increases by another 90 degree or not is examined at step 310. If the result is NO, supply of the zero-return alternating voltages is continued at step 311 to further reverse the magnet rotor Mr. If the result of the step 310 is YES, the change-over switch 80c is changed to the second connection state, and the change-over switch 80b is opened at step 312. Therefore, the phase-B field coil is opened at one end and connected to the output terminal 57 of the microcomputer 50a so that a voltage is induced in the phase-B field coil.

Subsequently, the induced voltage induced in the phase-B field coil 33 is inputted to the microcomputer 50a at step 313 and examined whether the induced voltage is equal to or lower than the threshold voltage Vth or not at step 320.

If the result of the step 320 is YES, it is presumed that the pointer 20 is stopped by the stopper unit S at step 321. After the step 321, the steps 152a-155 follow to provide the correction value a, which are described above. On the other hand, if the result of the step 320 is NO, it is presumed that the pointer 20 has not reached the zero-position. Therefore, the computer program proceeds to step 322 shown in FIG. 19.

At the step 322, the change-over switches 80b and 80c are changed to the first connection state. Thereafter, the magnet rotor Mr is further reversed by the computer 50a at step 323. Subsequently, whether the phase angle of the phase-A and phase-B zero-return alternating voltages increases by another 90 degree or not is examined at step 330. If the result is NO, supply of the zero-return alternating voltages is continued at step 331 to further reverse the magnet rotor Mr. If the result of the step 330 is YES, the change-over switch 70b is changed to the second connection state, and the change-over switch 70c is opened at step 332. Therefore, the phase-A field coil is opened at one end and connected to the output terminal 56 of the microcomputer 50a so that a voltage is induced in the phase-A field coil 32.

Subsequently, the induced voltage induced in the phase-A field coil 32 is inputted to the microcomputer 50a at step 333 and examined whether the induced voltage is equal to or lower than the threshold voltage Vth or not at step 340.

If the result of the step 340 is YES, it is presumed that the pointer 20 is stopped by the stopper unit S at step 341. After the step 341, the steps 152a-155 follow to provide the correction value α, which are described above. On the other hand, if the result of the step 340 is NO, it is presumed that the pointer 20 has not reached the zero-position. Thereafter, the computer program proceeds to the step 156 shown in FIG. 16.

As described above, the correction value α is written into the EEPROM 90 when the indicating instrument is manufactured in a factory. The phase-A and phase-B zero-return signals are supplied to the phase-A and phase-B field coils 32 and 33 after the phase angle thereof is adjusted. Therefore, whether the phase of the zero-return signals corresponds to the second and the following zero-levels can be accurately examined.

Even if there are dimensional variations in the indicating instruments, the pointer can be correctly stopped at the zero-position by the stopper unit S.

The correction value α can be set as a phase angle of one of the phase-A and phase-B field coils when the pointer is driven by the drive voltage to leave the stopper unit S and an induced voltage of the other becomes lower than the threshold voltage Vth.

Figure 21:
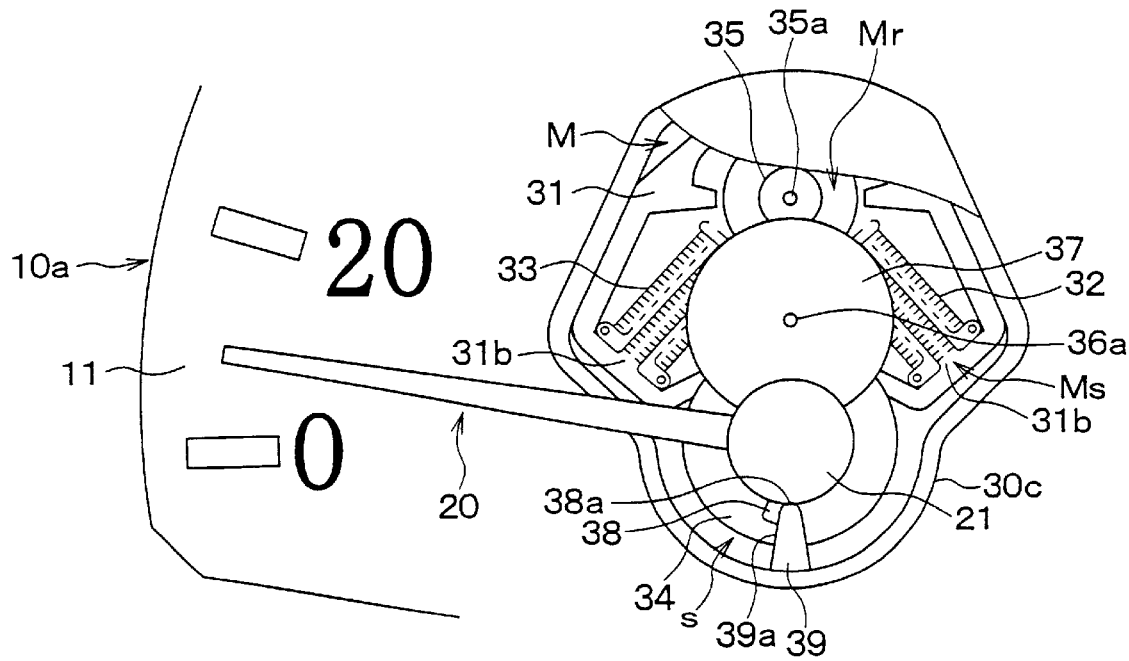
FIG. 21 is a schematic diagram of a main portion of the indicating instrument with a pointer leaving the zero-position.
Figure 22:
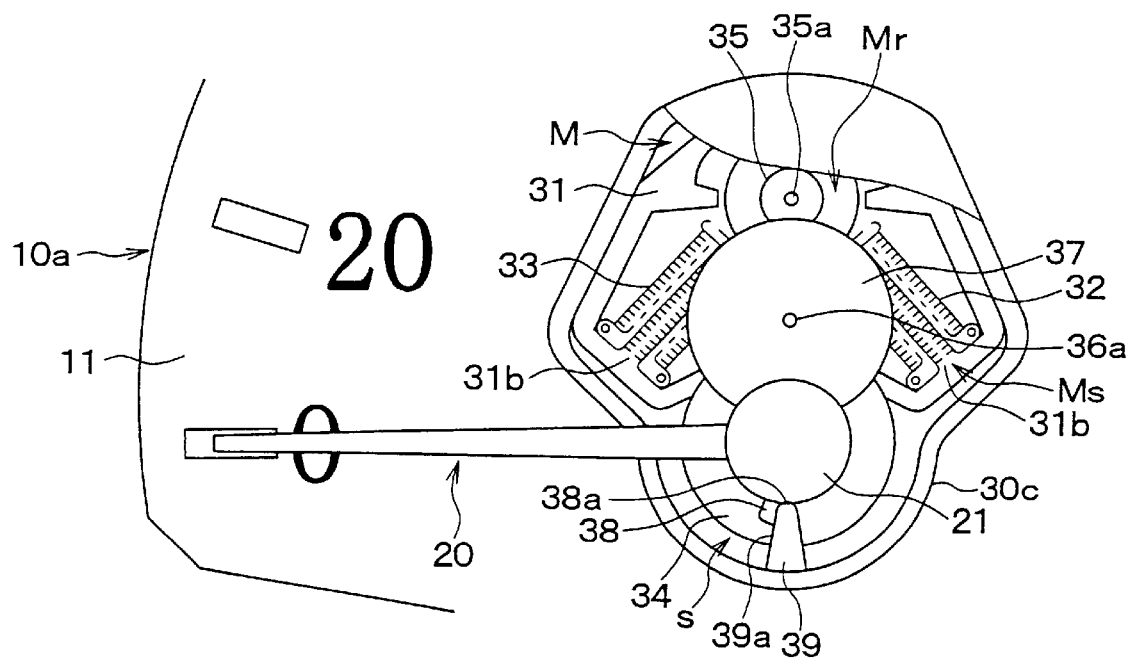
FIG. 22 is a schematic diagram of the main portion of the indicating instrument with the pointer being at the zero-position.

Operation of the stopper unit S is shown in FIGS. 21 and 22. The stopper unit S can be any type other than that shown in FIGS. 21 and 22. It can be disposed at the dial plate 10a to stop the edge of the pointer 20.

An indicating instrument according to a second embodiment of the invention is described hereafter. Because the hardware of the indicating instrument according to the second embodiment is the same as the indicating instrument according to the first embodiment, only the operation thereof is described with reference to FIGS. 1–5 and 23–27.

Figure 23:
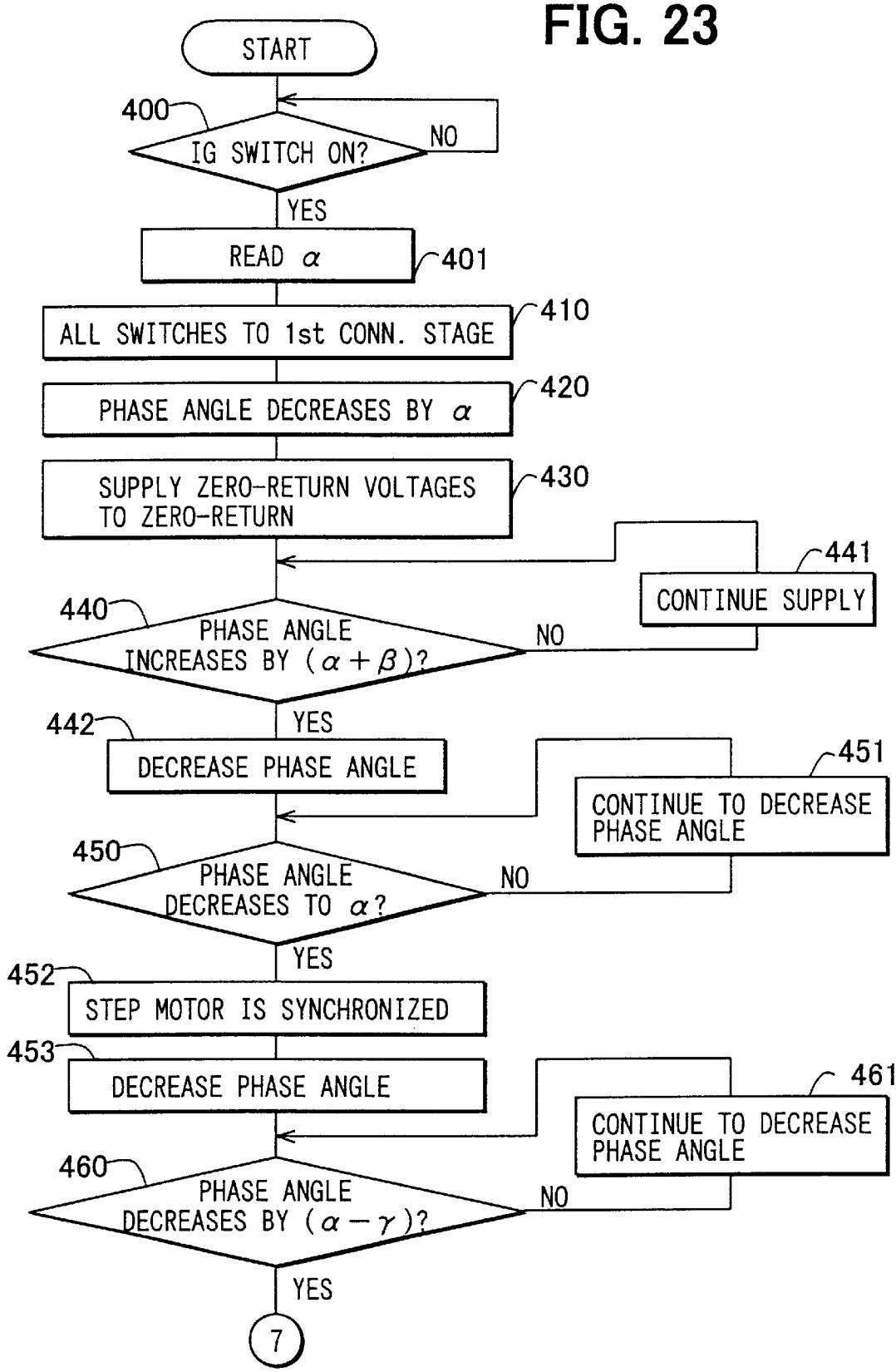
FIG. 23 is a flow diagram of the first half operation of the microcomputer of an indicating instrument according to a second embodiment of the invention.
Figure 24:
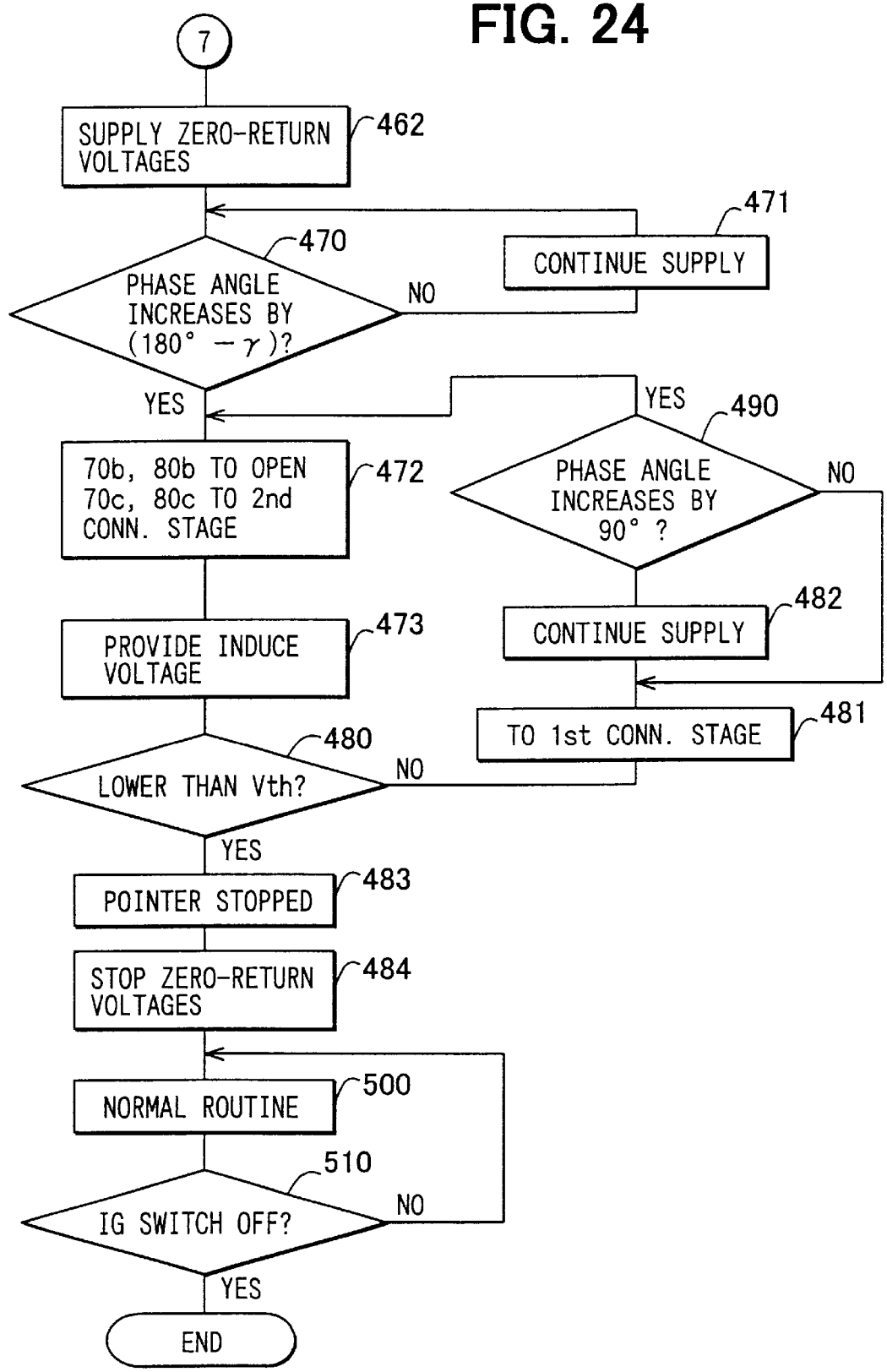
FIG. 24 is a flow diagram of the second half operation of the microcomputer of the indicating instrument according to the second embodiment.
Figure 25:
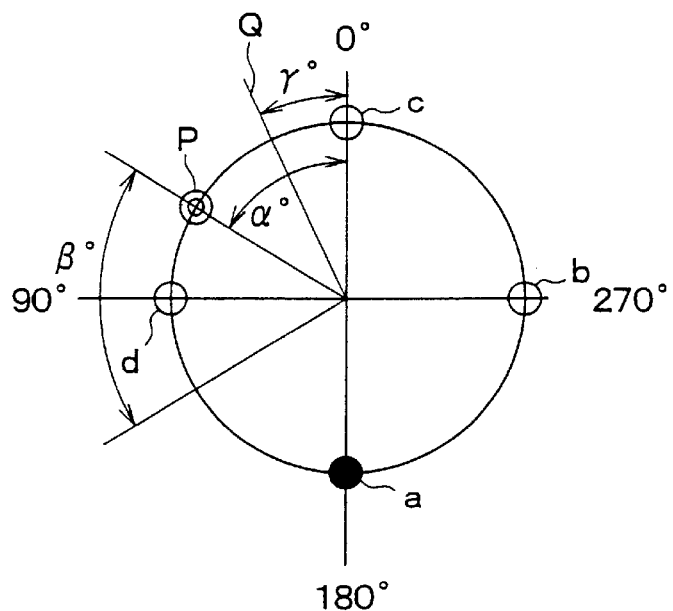
FIG. 25 is a diagram explaining how to examine whether the pointer returns to the zero-position or not.

The microcomputer shown in FIG. 5 executes a computer program as shown in FIGS. 23 and 24.

At step 400, whether the ignition switch IG is turned on or not is repeatedly examined. If the ignition switch IG is turned on, the result of the examination in the step 400 is YES, and a zero-position correction value α is read from the EEPROM 90 at step 401. Then the change-over switches 70b, 70c, 80b and 80c are changed to the first connection state at step 410. At this stage, the phase angle of the phase-A and phase-B zero-return alternating voltages to be supplied to the phase-A field coil 32 and the phase-B field coil 33 is shown by position P in FIG. 25.

Thereafter, zero-return alternating voltages that drive the pointer 20 an angle that corresponds to the zero-position correction value a are respectively supplied to the phase-A field coil 32 and the phase-B field coil 33 at step 420. Consequently, the phase angle of the zero-return alternating voltages decreases by the angle α and moves to position c. As soon as the phase angle moves to the point c, the phase-A zero-return alternating voltage is supplied by the drive circuit 70a from the microcomputer 50 to the phase-A field coil 32 via the change-over switches 70b and 70c, and the phase-B zero-return alternating voltage is supplied by the drive circuit 80a from the microcomputer 50 to the phase-B field coil 33 via the change-over switches 80b and 80c at step 430. Accordingly the step motor M reverses and the pointer 20 is driven by the speed reduction gear train G to move toward the zero-position.

Thereafter, whether the phase angle of the phase-A and phase-B zero-return alternating voltages increases by an electric angle (α+β) is examined at step 440. If the result of the step 440 is NO, supply of the zero-return alternating voltages is continued at step 441 to further reverse the magnet rotor Mr and the speed reduction gear train G. In the meanwhile, the electric angle β is an angle necessary to synchronize the magnetic field of the magnet rotor Mr and the magnetic field formed by the phase-A field coil 32 and the phase-B field coil 33. For example, the electric angle β corresponds to a phase angle between point P and a point located between point d and point a.

Thereafter, if the result of the step 440 is YES, the phase-A and phase-B zero-return signals being at the instant phase are respectively outputted by the drive circuits 70a and 80a via the change-over switches 70b, 70c, 80b and 80c to the phase-A field coil 32 and the phase-B field coil 33 to rotate the step motor M in the normal direction at a step 442. Therefore, the speed reduction gear train G rotates the pointer 20 clockwise at a reduced speed in FIG. 1. Thereafter, whether the phase angle of the phase-A and phase-B zero-return alternating voltages decreases by the electric angle β or not is examined at a step 450. In other words, whether the phase angle of the phase-A and phase-B zero-return alternating voltages returns to the point P that corresponds to the zero-position correction value α or not is examined at the step 450.

If the result of the step 450 is NO, the phase-A and phase-B zero-return signals are outputted continuously to further rotate the magnet rotor Mr in the clockwise direction at a step 451. If the result of the step 450 is YES, it is judged that the magnetic field of the magnet rotor Mr and the magnetic field formed by the phase-A and phase-B field coils have been synchronized with each other at step 452.

Figure 26:
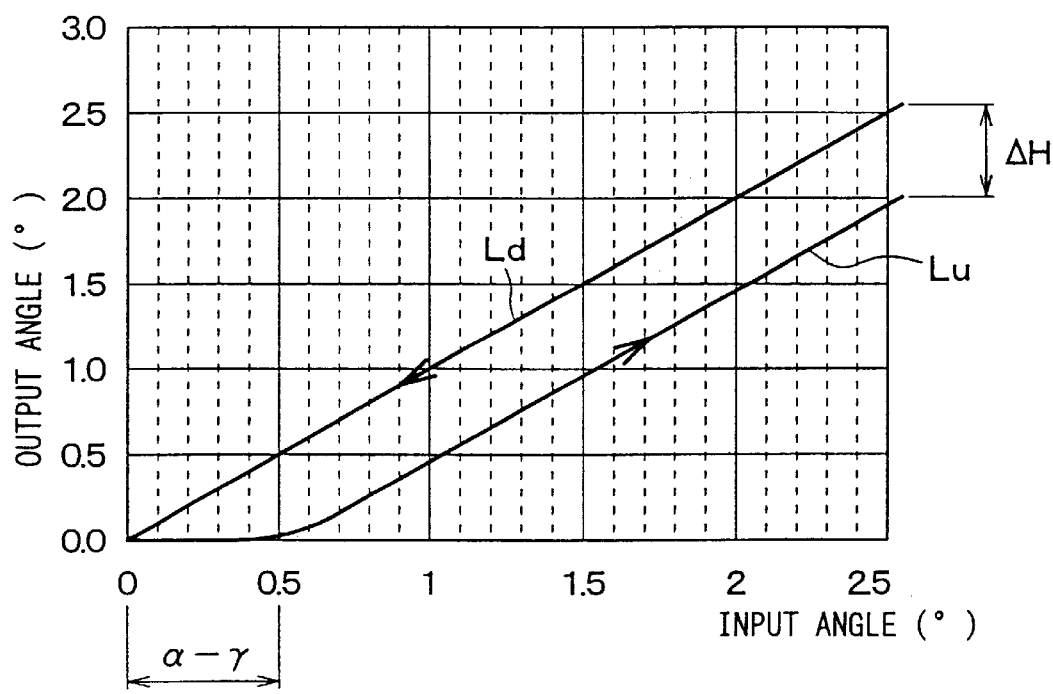
FIG. 26 is a graph showing operation of hysteresis of the pointer.
Figure 27:
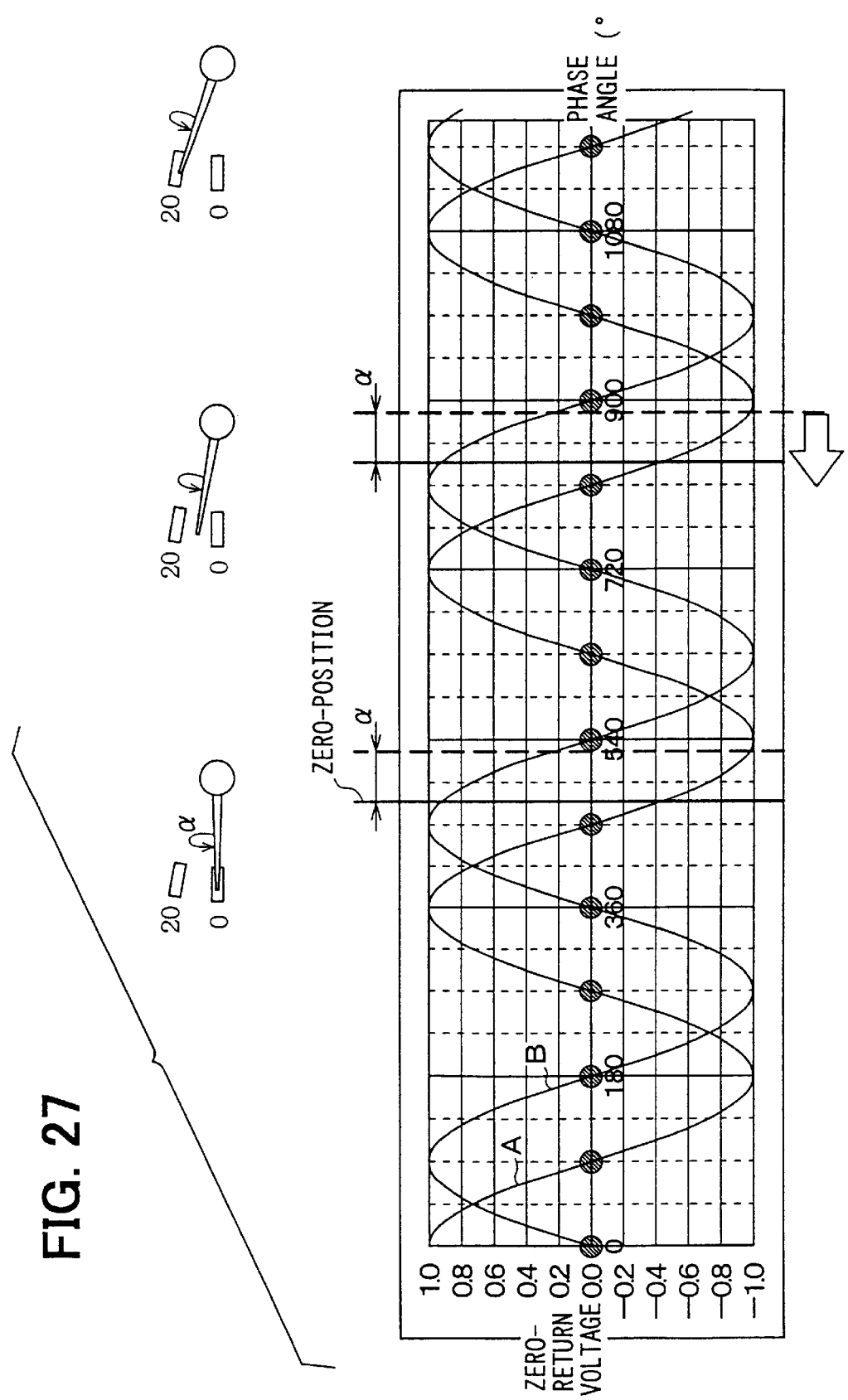
FIG. 27 is a timing chart of a pair of zero-return alternating signals.

Thereafter, the phase-A and phase-B zero-return signals are outputted continuously to further rotate the step motor in the clockwise direction at a step 453. Subsequently, whether the phase angle of the phase-A and phase-B zero-return alternating voltages returns by an electric angle (α–γ) to point Q at step 460. The angle (α–γ) is an electric angle that is sufficient to accelerate the magnet rotor Mr to return the pointer to the zero-position. As shown in FIG. 26, the output angle of the pointer 20 increases along line Lu as the input angle thereof that is proportional to the vehicle speed or the like increases. On the other hand the output angle of the pointer 20 decreases along line Ld as the input angle thereof decreases. There is a hysteresis ΔH between the line Lu and the line Ld. If the input angle is 0.5 degree, the output angle is zero. Thus, the angle (α–γ) is set 0.5, in this embodiment.

If the result of the step 460 is NO, the phase-A and phase-B zero-return signals are outputted continuously to further rotate the step motor in the clockwise direction at a step 461. Thereafter, the steps 460 and 461 are repeated until the phase angle of the phase-A and phase-B zero-return alternating voltages returns to the electric angle (α–γ) and YES is provided at the step 460.

If the result of the step 460 is YES, the drive circuit 70a supplies the phase-A zero-return alternating voltage from the microcomputer 50 to the phase-A field coil 32 via the change-over switches 70b and 70c, and the drive circuit 80a supplies the phase-B zero-return alternating voltage from the microcomputer 50 to the phase-B field coil 33 via the change-over switches 80b and 80c at step 462. Accordingly, the step motor M reverses and the speed reduction gear train G drives the pointer 20 toward the zero-position.

Thereafter, whether the phase angle of the phase-A and phase-B zero-return alternating voltages increases by an electric angle (180–γ) is examined at step 470. In other word, whether the phase of the phase-A and phase-B zero-return alternating voltages shifts from the point Q to the point a or not is examined.

If the result of the step 470 is NO, the phase-A and phase-B zero-return signals are outputted continuously to further reverse the magnet rotor Mr at step 471. If the result of the step 470 is YES, the change-over switches 70b and 80b are opened and the change-over switches 70c and 80c are changed to the second connection state at step 472. As a result, induced voltages are induced in the phase-A and phase-B field coils 32 and 33. Since the phase angle (α–γ) is taken into account beforehand, and the judgement is made at the point a instead of point d, the speed of the magnet rotor is sufficiently high to correctly sense the induced voltage.

Then, higher one of the induced voltages is inputted to the microcomputer 50 at step 473, and whether the induced voltage is lower than the threshold voltage Th or not is examined at step 480. If the inputted induced voltage is equal to or lower than the threshold voltage Th, YES is provided at the step 480. This means that the pointer 20 has reached the zero-position.

On the other hand, if the inputted induced voltage is higher than the threshold voltage Vth, NO is provided at the step 480. This means that the pointer has not reached the zero-position. Subsequently, all the change-over switches 70b, 70c, 80b and 80c are changed to the first connection state in the same manner described above at step 481, and the phase-A and phase-B zero-return signals are outputted continuously to further reverse the magnet rotor Mr at step 482. Then, whether the phase of the phase-A and phase-B zero-return alternating voltages increases by 90 degree or not is examined at step 490. In other words, whether the phase of the phase-A and phase-B zero-return alternating voltages reaches point b of the graph shown in FIG. 25 or not is examined.

If the result of the step 490 is NO, the magnet rotor Mr is further reversed at the step 482, and the next step 490 follows repeatedly until the result of the step 490 turns to YES. If the result of the step 490 turns to YES, the steps 472, 473 and 480 follow. Then, if the result of the step 480 is YES, it is judged that the pointer 20 is stopped by the stopper unit S. Consequently, the phase angle of the phase-A and phase-B voltages when the pointer reaches the zero-position is set to a prescribed electric angle, and the computer stop supply of the phase-A and phase-B voltages at step 484.

Thereafter, normal operation is started at step 500. That is: the change-over switches 70b, 70c, 80b and 80c are changed to the first connection state; and the phase-A and phase-B drive voltages are supplied at the prescribed phase thereof via the drivers 70 and 80 to the phase-A and phase-B field coils 32 and 33 according to the output signal of the vehicle speed sensor 60. Therefore, the step motor M rotates in the normal drive direction, and the speed reduction gear train G rotates the pointer in the clockwise direction at a reduced speed to indicate a vehicle speed, as long as the ignition switch IG is turned on. If the ignition switch IG is turned off, YES is provided at step 510, and the computer program ends.

In the indicating instrument according to the second embodiment, the zero-position correction value α and the phase angle β are used to synchronize the phase-A and phase-B drive voltages and the magnet rotor Mr. Further, the phase angle (α–γ) is set to accelerate the magnet rotor Mr so as to provide a sufficient amplitude of the induced voltage. Therefore, the zero-return of the pointer can be detected accurately.

The zero-position correction value α can be a phase angle of one of the phase-A and phase-B drive voltages when the pointer 20 leaves the stopper unit S, and, consequently, the induced voltage becomes lower than the threshold voltage Vth.

The shape of the drive voltages or the zero-return alternating voltages can be sinusoidal, trapezoidal, triangular or the like as long as they are alternating voltages.

In the foregoing description of the present invention, the invention has been disclosed with reference to specific embodiments thereof. It will, however, be evident that various modifications and changes may be made to the specific embodiments of the present invention without departing from the scope of the invention as set forth in the appended claims. Accordingly, the description of the present invention is to be regarded in an illustrative, rather than a restrictive, sense.

What is claimed is:

1. An indicating instrument for a vehicle comprising:
   a pointer disposed to move over said display portion between a zero position and a maximum position corresponding to said maximum value;
   a step motor including a stator and a magnet rotor connected to said pointer for moving said pointer when an alternating signal is supplied thereto;
   a stopper unit for stopping said pointer when said pointer reaches said zero position;
   driving means for supplying said stator with a driving alternating signal to move said pointer in response to said analog signal;
   zero-return means for supplying said stator with a zero-return alternating signal to move said pointer toward said zero-position;
   storing means for pre-storing a zero-level electric angle in which said zero-return alternating signal becomes a zero level at least twice after said zero-return signal is supplied to said stator;
   first examining means for examining whether a phase angle of said zero-return alternating signal reaches said zero-level electric angle or not after said zero-return alternating signal is supplied to said stator;
   interrupting means for interrupting said zero-return alternating signal to provide induced voltage induced in said stator when it is presumed that said zero-return alternating signal reaches said zero-level electric angle; and
   second examining means for examining whether said induced voltage is equal to or lower than a threshold voltage that indicates that said pointer is stopped.

2. The indicating instrument for a vehicle as claimed in claim 1, further comprising a speed reduction gear train, connected between said magnet rotor and said pointer, for driving said pointer at a reduced rotation speed proportional to a rotation speed of said magnet rotor.

3. The indicating instrument for a vehicle as claimed in claim 1, further comprising a dial plate having a display portion displaying an analog value between a maximum value and a minimum value in an arc shape.

4. The indicating instrument for a vehicle as claimed in claim 1, wherein
   said stator comprises a pair of field coils.

5. An indicating instrument for a vehicle comprising:
   a dial plate having a display portion displaying an analog value between a maximum value and a minimum value in an arc shape;
   a pointer disposed to move over said display portion between a zero position corresponding to said minimum value and a maximum position corresponding to said maximum value;
   a step motor including a stator and a magnet rotor;
   a stopper unit for stopping said pointer when said pointer reaches said zero position;
   drive means for supplying said stator of said step motor with a drive alternating signal to move said pointer in response to said analog value;
   zero-return means for supplying said stator with a zero-return alternating signal to move said pointer toward said zero-position;
   storing means for storing a phase angle of said zero-return signal as a zero-return angle correction value if an induced voltage, which is induced in said stator when said zero-return alternating signal is interrupted after said zero-return alternating signal becomes a zero level at least twice, becomes lower than a threshold value that indicates that said pointer is stopped;
   adjusting means for adjusting said zero-return alternating signal to zero phase by said zero-return angle correction value when said zero-return alternating signal is supplied to said stator;
   synchronizing means for synchronizing said zero-return alternating signal and rotation of said magnet rotor when said zero-return alternating signal is supplied to said stator after said phase of said zero-return alternating signal is adjusted;
   first examining means for examining whether phase angle of said zero-return alternating signal reaches a zero-level electric angle that corresponds to a zero level of said zero-return alternating signal at least twice or not after said alternating signal is supplied to said stator; and
   second examining means for examining whether said induced voltage is equal to or lower than a threshold voltage that indicates that said pointer is stopped; wherein
   said drive means supplies said drive alternating signal at the phase thereof immediately when said second examining means judges that said induced voltage is equal to or lower than said threshold voltage.

6. The indicating instrument as claimed in claim 5, further comprising a speed reduction gear train connected between said pointer and said pointer for moving said pointer at a reduced rotation speed proportional to a rotation speed of said magnet rotor.

7. The indicating instrument as claimed in claim 5, further comprising accelerating means for decreasing phase angle of said zero-return alternating signal outputted by said zero-return means to accelerate said magnet rotor.

8. The indicating instrument as claimed in claim 5, further comprising:

means for examining whether phase of said zero-return signal increases by a predetermined angle or not after said adjusting means adjust said zero-return alternating signal to zero phase; and means for decreasing phase of said zero-return signal to a phase that corresponds to said zero-return angle correction value.

9. A system for setting zero-return correction angle of a step motor including a stator, a magnet rotor for rotating in response to an alternating signal supplied to said stator and a stopper unit for stopping said magnet rotor when said magnet rotor reaches a zero position, said system comprising:

adjusting means (110) for adjusting said alternating signal to zero phase when said alternating signal is supplied to said stator;

first examining means for examining whether phase angle of said alternating signal reaches a zero-level electric angle that corresponds to a zero level of said alternating signal at least twice or not after said alternating signal is supplied to said stator;

second examining means for examining whether said induced voltage is equal to or lower than a threshold voltage that indicates that said magnet rotor is stopped; and setting means for setting said zero-level electric angle at which said induced voltage is equal to or lower than said threshold voltage as a zero-return-angle correction-value.

10. A system for setting zero-return correction angle of a pointer of an indicating instrument for a vehicle including a step motor having a stator and a magnet rotor for moving said pointer when an alternating signal is supplied to said stator, and a stopper unit for stopping said pointer when said pointer reaches said zero position and a drive unit for driving said step motor, wherein said system comprises:

first means for adjusting said alternating signal to zero phase when said alternating signal is supplied to said stator;

second means for examining whether phase angle of said alternating signal reaches a zero-level electric angle that corresponds to a zero level of said alternating signal at least twice or not after said alternating signal is supplied to said stator;

third means for cutting supply of said alternating signal to said stator to provide an induced voltage in said stator induced by said magnet rotor when said second means judges that the phase angle of said alternating signal reaches said zero-level electric angle;

fourth means for examining whether said induced voltage is equal to or lower than a threshold voltage that indicates that said pointer is stopped by said stopper unit; and fifth means for setting said zero-level electric angle at which said induced voltage is equal to or lower than said threshold voltage as a zero-return-angle correction-value.

11. The system as claimed in claim 9, further comprising:

a camera for sensing position of said pointer;

sixth means for supplying a drive signal to said stator to rotate said magnet rotor so that said pointer leaves said stopper unit;

seventh means for setting a phase angle of said drive signal as zero-return-angle correction-value when said camera senses said pointer starting to leave instead of said zero-level electric angle at which said induced voltage is equal to or lower than said threshold voltage; and a memory for pre-storing said zero-return-angle correction-value.

* * * * *